United States Patent [19]
Tomishima et al.

[11] Patent Number: 5,602,793
[45] Date of Patent: Feb. 11, 1997

[54] SEMICONDUCTOR MEMORY DEVICE HAVING POWER LINE ARRANGED IN A MESHED SHAPE

[75] Inventors: Shigeki Tomishima; Mikio Asakura; Kazutami Arimoto; Hideto Hidaka, all of Hyogo-ken, Japan

[73] Assignee: Mitsubishi Denki Kabushiki Kaisha, Tokyo, Japan

[21] Appl. No.: 417,527

[22] Filed: Apr. 6, 1995

Related U.S. Application Data

[62] Division of Ser. No. 224,461, Apr. 7, 1994, Pat. No. 5,426,615, which is a division of Ser. No. 942,320, Sep. 10, 1992, Pat. No. 5,325,336.

[51] Int. Cl.$^6$ ................................................. G11C 5/14
[52] U.S. Cl. .......................... 365/226; 365/207; 365/63
[58] Field of Search ............................. 365/51, 63, 207, 365/203, 226

[56] References Cited

U.S. PATENT DOCUMENTS

| | | | |
|---|---|---|---|
| 4,739,497 | 4/1988 | Itoh et al. | 365/189.09 |
| 4,748,596 | 5/1988 | Ogura et al. | 365/207 |
| 4,849,943 | 7/1989 | Pfennings | 365/230.03 |
| 4,969,123 | 11/1990 | Norwood et al. | 365/51 |
| 5,007,025 | 4/1991 | Hwang et al. | 365/226 |
| 5,293,559 | 3/1994 | Kim et al. | 365/63 |
| 5,321,658 | 6/1994 | Ishimura et al. | 365/63 X |
| 5,325,336 | 6/1994 | Tomishima et al. | 365/207 |
| 5,426,615 | 6/1995 | Tomishima et al. | 365/226 |

FOREIGN PATENT DOCUMENTS

| | | |
|---|---|---|
| 57-198592 | 12/1982 | Japan . |
| 62-21240 | 1/1987 | Japan . |
| 62-188363 | 8/1987 | Japan . |

OTHER PUBLICATIONS

Toshio Yamada, et al, "A 64 Mb DRAM with Meshed Power Line and Distributed Sense–Amplifier Driver", 1991 IEEE International Solid–State Circuits Conference, Digest of Technical Papers, pp. 108–109.

Satoshi Takano, et al, "A GaAs 16K SRAM with a Single 1–V Supply", IEEE Journal of Solid–State Circuits, vol. SC–22, No. 5, Oct. 1987, pp. 699–703.

*Primary Examiner*—Joseph A. Popek
*Attorney, Agent, or Firm*—Lowe, Price, Leblanc & Becker

[57] ABSTRACT

A semiconductor memory device includes a sense amp band including a plurality of sense amplifiers, and a plurality of operation power supply potential lines and a plurality of ground potential lines arranged in a meshed shape. The operation power supply potential lines and the ground potential lines include the lines arranged in parallel with and in proximity to the sense amp band. Each sense amplifier in the sense amp band is connected to an operation power supply potential line and a ground line arranged in proximity to and in parallel with the sense amplifier through a drive component. The drive component is provided one for a predetermined number of sense amplifiers, and is rendered conductive in response to a sense amplifier activation signal from a signal line arranged in parallel with the sense amp band. The plurality of operation power supply potential lines and the plurality of ground lines arranged in a meshed shape are contacted at crossings. Therefore, in the semiconductor memory device, no distribution of power supply potentials is generated to allow a stable supply of a power supply potential and a ground potential to an arbitrary circuit portion. In addition, since a sense amplifier is connected to a proximate operation power supply potential line and ground line through a drive component, a reliable and high-speed sensing operation is possible irrespective of a length of a sense amp drive signal line.

19 Claims, 15 Drawing Sheets

SEMICONDUCTOR MEMORY DEVICE HAVING POWER LINE ARRANGED IN A MESHED SHAPE

This application is a division of application Ser. No. 08/224,461 filed Apr. 7, 1994, now U. S. Pat. No. 5,426,615 which is a division of application Ser. No. 07/942,320, filed Sep. 10, 1992, now U. S. Pat. No. 5,325,336.

BACKGROUND OF THE INVENTION

1. Field of the Invention

The present invention relates generally to semiconductor memory devices, and more particularly, to a layout of power lines in a semiconductor memory device. More specifically, the present invention relates to an arrangement for driving sense amplifiers in a dynamic-type semiconductor memory device.

2. Description of the Background Art

A dynamic-type semiconductor memory device includes a memory cell composed of one MOS (insulated gate type field effect) transistor and one capacitor, and has a small area per bit accordingly. Such structural characteristics relatively readily realize a large storage capacity dynamic-type semiconductor memory device with high integration, high density, low cost per bit and a reduced chip area.

FIG. 1 is a schematic diagram of an entire arrangement of a conventional dynamic-type semiconductor memory device. With reference to FIG. 1, the dynamic-type semiconductor memory device includes a memory cell array 1 having a plurality of dynamic-type memory cells arranged in a matrix of rows and columns, an address buffer 2 for receiving external address signals A0-An and generating internal address signals, a row decoder 4 for decoding the internal address signals from the address buffer 2 and selecting a corresponding row of the memory cell array 1, a column decoder 5 for decoding the address signals from the address buffer 2 and generating a column selection signal for selecting a corresponding column of the memory cell array 1, a sense amp band 8 for sensing, amplifying, and latching information of memory cells connected to the row selected by the row decoder 4 of the memory cell array 1, and an I/0 gate 10 responsive to a column selection signal from the column decoder 6 for connecting a corresponding column of the memory cell array 1 to an internal data transmission line (I/O line).

The sense amp band 8 includes sense amplifiers provided corresponding to the respective columns of the memory cell array 1. Row address signals and column address signals are time-division-multiplexedly applied to the address buffer 2. The row decoder 4 decodes row address signals from the address buffer 2. The column decoder 6 decodes column address signals from the address buffer 2.

The dynamic-type semiconductor memory device further includes a control circuit 12 for receiving externally applied control clock signals, that is, a row address strobe signal $\overline{RAS}$, a column address strobe signal $\overline{CAS}$ and a write enable signal $\overline{WE}$ to generate various internal control signals, a sense amp activation circuit 14 for generating signals for activating the sense amplifiers included in the sense amp band 8 in response to an internal control signal from the control circuit 12, and a sense amp drive circuit 16 for driving the sense amplifiers included in the sense amp band 8 in response to the sense amp activation signals from the sense amp activation circuit 14.

The signal $\overline{RAS}$ provides timing at which the address buffer 2 receives the external address signals A0-An as row address signals to generate internal row address signals, and also determines a memory cycle period of the dynamic-type semiconductor memory device.

The signal $\overline{CAS}$ provides timing at which the address buffer 2 receives the internal address signals A0-An as column address signals to generate internal column address signals. The signal $\overline{WE}$ determines the operation mode of the dynamic-type semiconductor memory device into a data writing operation mode or a data reading operation mode. The internal control signals from the control circuit 12 are applied to the address buffer 2, the row decoder 4 and the column decoder 6 and they are further applied to an input/output circuit 18.

The input/output circuit 18 communicates data with a selected memory cell in the memory cell array 1 through the I/O gate 10. The input/output circuit 18, in the data writing operation mode, receives external write data DQ to generate internal write data and transmits the internal write data to a selected memory cell through the internal data transmission line and the I/O gate 10. In the data reading operation mode, the input/output circuit 18 generates external read data from the data of the selected memory cell, which data is transmitted to the internal data transmission line, through the I/O gate 10.

The sense amp activation circuit 14 generally delays the internal row address strobe signal RAS generated by the control circuit 12 by a predetermined time period to generate a sense amp activation signal. The sense amp drive circuit 15 drives sense amplifiers included in the sense amp band 8 in response to the sense amp activation signal. Operations of the sense amp drive circuit 16 and the sense amplifiers of the sense amp band 8 will be described in detail later.

The dynamic-type semiconductor memory device further includes an operation power supply potential line 22 connected to a power supply pad 20 for receiving an operation power supply potential Vcc and a ground line 26 connected to a ground pad 24 for receiving a ground potential Vss. The operation power supply potential line 22 and the ground line 26 for supplying a ground potential are both shown arranged to surround the memory device along a chip periphery. The arrangement of the power supply potential line 22 for supplying an operation power supply potential and the ground line 26 to surround the memory device aims an a stable supply of power supply voltages Vcc and Vss to an arbitrary position of the memory device through the power lines (including both of the power supply potential line and the ground line) 22 and 26 with a large width.

FIG. 2 is a diagram showing an arrangement of the memory cell array, the sense amp band and the sense amp driver circuit shown in FIG. 1. In FIG. 2, the memory cell array 1 includes a plurality of word lines WLs (only one of which is represented in FIG. 1) to each of which a row of memory cells MC is connected, and a plurality of pairs of bit lines BL and $\overline{BL}$ to each of which a column of memory cells MC is connected. A bit line BL and a complementary bit line $\overline{BL}$ are paired, to which data complementary to each other are transmitted. In a sensing operation, one of the bit line BL and the complementary bit line $\overline{BL}$ provides a reference potential to a potential of the other. The memory cell MC is arranged at a crossing between a word line WL and a bit line BL or $\overline{BL}$. In other words, one memory cell MC is disposed at a crossing between a pair of bit lines and one word line.

Sense amplifiers SA included in the sense amp band 8 are disposed in parallel with a word line WL at one side of the memory cell array 1. The sense amplifier SA is arranged corresponding to each pair of bit lines BL and $\overline{BL}$. All of the sense amplifiers SA included in the sense amp band 8 are connected through sense amp drive signal lines SP and SN. The reason why there are provided two separate signal lines of a sense amp drive signal line SP and a sense amp drive signal line SN is, as will be described in detail later, that the sense amplifier SA amplifies a potential on one bit line of a pair of bit lines BL and $\overline{BL}$ to an operation power supply potential Vcc level and amplifies the other bit line to a ground potential Vss level.

An equalize circuit EQ is provided for sense amp drive signals SP and SN in order to equalize the potentials thereof.

The sense amp drive circuit 16 connects the power supply potential line 24 and the ground line 26 arranged in parallel with bit lines BL and $\overline{BL}$ in proximity to the memory cell array 1 to sense amp drive signal lines SP and SN, respectively, in response to sense amp activation signals SO, $\overline{SO}$ and SOF. The sense amp drive circuit 16 includes a P channel MOS transistor P3 for connecting the sense amp drive signal line SP to the power supply potential line 24 in response to the sense amp activation signal $\overline{SO}$, an N channel MOS transistor N3 for connecting the sense amp drive signal line SN to the ground line 26 in response to the sense amp activation signal SOF and an N channel MOS transistor N4 for connecting the sense amp drive signal line SN to the ground line 26 in response to the sense amp activation signal SO.

The N channel MOS transistor N3 has a relatively small current drivability, while the N channel MOS transistor N4 has a relatively large current drivability. First, the N channel MOS transistor N3 is turned on, so that the sense amp drive signal line SN is relatively slowly discharged to the ground potential Vss. Then, the N channel MOS transistor N4 is turned on, so that the sense amp drive signal line SN is discharged to the ground potential Vss at a high speed.

Such two-step drive of the sense amp drive signal line SN aims at improving sensitivity of sense amplifiers. In other words, the sense amp drive signal line SN is gradually discharged to the ground potential Vss level, the sense amplifier SA amplifies, to some extent, a potential difference between bit lines of each bit line pair and then the sense amp drive signal line SN is discharged to the ground potential Vss at a high speed. Thus, a sensing operation is performed at a high speed without reducing sensitivity of the sense amplifiers SA.

FIG. 3 is a diagram specifically showing an arrangement of the dynamic-type memory cell shown in FIG. 2. Shown as examples in FIG. 3 are a memory cell MC1 arranged an a crossing between a word line WL1 and a bit line BL and a memory cell MC2 arranged at a crossing between a word line WL2 and a complementary bit line $\overline{BL}$. The memory cell MC1 includes a memory cell capacitor C1 for storing information in the form of electric charges, and a transfer gate MT1 comprising a N channel MOS transistor having a gate connected to the word line WL1, a source connected to the bit line BL and a drain connected to one electrode (storage node) of the memory capacitor C1. Similarly, the memory cell MC2 includes a memory capacitor C2 and a transfer gate MT2.

FIG. 4 is a diagram illustrating a specific arrangement of the sense amplifier SA shown in FIG. 2. In FIG. 4, the sense amplifier SA includes cross-coupled P channel MOS transistors P1 and P2 and cross-coupled N channel MOS transistors N1 and N2. The transistor P1 has a gate connected to the complementary bit line $\overline{BL}$ and a drain connected to the bit line BL. The transistor P2 has a gate connected to the bit line BL and a drain connected to the complementary bit line $\overline{BL}$. Sources of the transistors P1 and P2 are in common connected to sense amp drive signal line SP.

The N channel MOS transistor N1 has a gate connected to the complementary bit line $\overline{BL}$ and a drain connected to the bit line BL. The transistor N2 has a gate connected to the bit line BL and a drain connected to the complementary bit line $\overline{BL}$. Sources of the transistors N1 and N2 are in common connected to the sense amp drive signal line SN.

The transistors P1 and P2 constitute a P channel sense amplifier to amplify a higher potential of the potentials of the bit lines BL and $\overline{BL}$ to the operation power supply potential Vcc level. The N channel MOS transistors N1 and N2 constitute an N channel sense amplifier to amplify a lower potential of the potentials of the bit lines BL and $\overline{BL}$ to a ground potential Vss level.

FIG. 5 is a diagram illustrating an arrangement of the equalize circuit EQ shown in FIG. 2. The equalize circuit EQ includes an N channel MOS transistor N5 having a gate connected to receive an equalize signal EQS, a drain connected to the sense amp drive signal line SP and a source connected to the sense amp drive signal line SN, an N channel MOS transistor N6 having a drain connected to the sense amp drive signal line SN, a gate connected to receive the equalize signal EQS and a source coupled to receive a predetermined precharge potential VBL (normally at a level of Vcc/2), and an N channel MOS transistor N7 having a gate coupled to receive the equalize signal EQS, a source connected to the drive signal line SP and a drain connected to receive a precharge potential VBL. The transistor N5 short-circuits the drive signal lines SN and SP in response to the equalize signal EQS. The transistors N6 and N7 are turned on in response to the equalize signal EQS to maintain the drive signal lines SN and SP at a potential level of the precharge potential VBL.

Normally, a circuit having the same arrangement as that of the equalize circuit EQ shown in FIG. 5 is provided corresponding to a pair of bit lines BL and $\overline{BL}$. The bit lines are precharged to a precharge potential of an intermediate potential of Vcc/2 level in a stand-by state. Operations of the circuits shown in FIGS. 2 to 5 will be described with reference to FIG. 6 which is an operation waveform diagram of these circuits.

When the signal $\overline{RAS}$ is at "H" (logical high), the memory device is in a stand-by state wherein the sense amp drive signal lines SP and SN are precharged to a predetermined precharge potential VBL and bit lines BL and $\overline{BL}$ are similarly precharged to an intermediate potential of Vcc/2.

When the signal $\overline{RAS}$ falls to "L" (logical low), a memory cycle starts. In response to the fall of the signal $\overline{RAS}$, the address buffer 2 (see FIG. 1) generates an internal row address signals and applies the same to the row decoder 4. The row decoder 4 decodes the applied internal row address signals and selects a corresponding word line WL in the memory cell array 1 to bring a potential on the selected word line WL to "H".

In response to the rise of the potential on the selected word line WL, a transfer gate MT (a gate MT1 or MT2 in FIG. 3) in a memory cell connected to the selected word line is turned on. As a result, electric charges corresponding to storage information of the memory cell MC connected to the selected word line WL are moved between the cell MC and the bit lane BL (or $\overline{BL}$). The movement of the electric charges changes a potential on the bit line BL or $\overline{BL}$. In FIG. 6, the selected memory cell stores information "0", which causes a reduced potential on the bit line BL. No electric charge is moved for the other bit line (bit line $\overline{BL}$ in FIG. 6), whose potential in turn is at a predetermined precharge potential level. Herein, the respective bit lines BL and $\overline{BL}$ are released from a precharge/equalize state to assume a floating state in response to a fall of the signal $\overline{RAS}$. This is also the case with the equalize circuit EQ provided at the sense amp drive signal lines SP and SN.

Then, the potential on the selected word line WL is increased and after a lapse of a predetermined time, the sense amp activation signal SOF first rises from "L" to "H", thereby turning on the transistor N3. As a result, the perennial of the sense amp drive signal line SN is gradually decreased from the precharge potential VBL to the ground potential Vss level. Responsively, the N channel sense amplifier in the sense amplifier SA operates to amplify a small potential difference between the bit lanes BL and $\overline{BL}$. At this time, since the small potential difference between the bit lines BL and $\overline{BL}$ is gradually amplified, sensitivity of the sense amplifier SA is improved to accurately amplify the potential difference between the bit Lines BL and $\overline{BL}$.

Then, after the potential difference between the bit lines BL and $\overline{BL}$ is amplified to some extent, the sense amp activation signal SO is brought to "H". As a result, the transistor N4 is turned on, so that the sense amp drive signal line SN is discharged to the ground potential Vss at a high speed. The transistor N4 causes the N channel sense amplifier in the sense amplifier SA to amplify a potential difference between the corresponding bit lines BL and $\overline{BL}$ at a high speed. Such two-step drive of the N channel sense amplifier enables discharge of a potential on a bit line having a lower potential out of the bit lines BL and $\overline{BL}$ to the ground potential level with high sensitivity and at a high speed.

Then, the sense amp activation signal $\overline{SO}$ is brought down to "L" from "H", and the sense amp drive signal line SP is connected to the power supply potential line 24 through the drive transistor P3. As a result, the P channel sense amplifiers included in the sense amplifier SA are activated to bring a bit line with a higher potential out of the bit lines BL and $\overline{BL}$ up to the power supply potential Vcc level (FIG. 6 shows a state wherein the complementary bit line $\overline{BL}$ is charged to "H", while the bit line BL is discharged to "L" level).

Then, the column address strobe signal $\overline{CAS}$ falls to "L", whereby the address buffer 2 generates internal column address signals. The column decoder 6 decodes the generated internal column address signals. At this time point, potentials on the bit lines BL and $\overline{BL}$ are stabilized to "L" and "H". As a result, a corresponding column is selected out of the memory cell array 1 and the selected column (that is, a bit line pair) is connected to the internal data transmission line. The signal $\overline{WE}$ determines which of data writing and data reading is to be performed. When the signal $\overline{WE}$ is at "H", data reading is to be performed, while when the signal $\overline{WE}$ is at "L", data writing is to be performed.

When the data writing or reading is performed, the dynamic-type semiconductor memory device returns to a stand-by state in preparation for a subsequent access cycle. In other words, the signals $\overline{RAS}$ and $\overline{CAS}$ sequentially rise to "H".

Responsively, the potential on the selected word line WL falls to "L", while the sense amp activation signals SO and SOF, and $\overline{SO}$ are returned to "L" and "H" of an inactive state. In parallel therewith, the equalize signal EQS rises to "H". The equalize circuit EQ is activated and the transistors N5, N6 and N7 (see FIG. 5) included in the equalize circuit EQ are all turned on. The sense amp drive signal lines SP and SN which have been at "H" and "L" levels are short-circuited to each other to attain an intermediate potential, Vcc/2.

At the same time, a precharge potential VBL (Vcc/2 level) generated by separate VBL generation circuit (not shown) is transmitted to the sense amp drive signal lines SP and SN through the transistors N6 and N7. As a result, the sense amp drive signal lines SN and SP are fixed to a precharge potential level to prepare for a subsequent sensing operation. The reason why the sense amp drive signal line is maintained at a precharge level of Vcc/2 is the same as that why the bit lines BL and $\overline{BL}$ are precharged to an intermediate potential, Vcc/2. That is, it is intended for reduction of power consumption and speed-up of a sensing operation.

With an increase in integration and a capacity of a dynamic-type semiconductor memory device, the nun%her of bit lines included in a memory cell array is increased and the number of sense amplifiers is accordingly increased. As a result, an increased number of sense amplifiers are connected to one sense amp drive signal line, and a length of the sense amp drive signal line is also increased. As a result, a resistance and a capacitance of the sense amp drive signal line are made larger.

In a conventional dynamic-type semiconductor memory device, each sense amplifier is connected to a power supply line (an operation power supply potential line and a ground line) arranged in parallel with a bit line on one side of a memory cell array through a sense amp drive circuit. Such arrangement causes a resistance and a capacitance of a sense amp drive signal line to give more effect on a sensing operation. Such problem will be described in the following.

Consideration is now given to potential changes of a node SN1 of the sense amp drive signal line located closest to the power supply lines 24 and 26 and a node SNn of the sense amp drive signal line SN farthest from the power supply Lines 24 and 26 as shown in FIG. 7. It is assumed that the sense amplifier SA of the node SN1 drives the bit line BL1, while the sense amplifier SA of the node SNn drives the bit line BLn.

When the sense amp activation signal SOF rises, the potential of node SN1 falls from the precharge level to the ground potential Vss level at a relatively high speed. On the other hand, the potential of the node SNn is gradually reduced by a resistance and a capacitance of the drive signal line SN. Therefore, a sensing operation of the bit line BL1 is carried out at a high speed, while a sensing operation of the bit line BLn is performed slowly.

Then, when the sense amp activation signal SO rises, the sense amp drive signal line SN is discharged to the ground potential Vss at a high speed. At the this time, the SN1 discharges electric charges of the bit line BL1 to the ground potential Vss at a high speed, while the node SNn gradually discharges electric charges of the bit line BLn due to the resistance and the capacitance of the drive signal line SN. A sensing operation of the bit line BLn therefore requires more time. An access time in data writing or reading is determined by the longest sensing operation time of the bit line BLn. As a result, an access time of the dynamic-type semiconductor memory device is increased.

Because of the resistance of the sense amp drive signal line SN, the drive signal line SN has a potential distribution, with a potential of the node SNn increased from the ground potential Vss by the potential VR. In this case, the discharged potential of the bit line BLn becomes higher than the ground potential Vss by a potential VR'. At this time, a P channel sense amplifier encounters the same problem, reducing a potential difference between bit lines BL and $\overline{BL}$ to disable stable data writing and reading.

Furthermore, an equalize circuit EQ is provided only at one end portion of each of the sense amp drive signal lines SN and SP. Therefore, while the equalize circuit EQ operates, a precharge potential VBL of the sense amp drive signal line SN is precharged to a potential VBL' lower than the desired intermediate potential Vcc/2 due to an interconnection resistance, which prevents an accurate sensing operation.

The problem illustrated in FIG. 7 similarly occurs to a P channel sense amplifier. Therefore, a conventional arrangement of an equalize circuit EQ and a sense amp drive circuit 16 provided only at one end portion of each of sense amp drive signal lines SP and SN can not ensure an accurate sensing operation as a capacity of a dynamic-type semiconductor memory device is increased.

In addition, in a conventional dynamic-type semiconductor memory device, a power supply line is located only along a periphery of a chip and a power supply potential required for each circuit is taken out of the power supply lines 24 and 26 proximate thereto through an interconnection. In this case, a desired power supply potential Vcc or Vss can not be obtained on a power supply line located farthest from the pads 20 and 24 (see FIG. 1), so that no accurate operation power supply potential or ground potential can be applied to each circuit. When the power supply potentials Vcc and Vss differ depending on a position in a semiconductor memory device, a signal potential varies according to a position in the device, which prevents an accurate operation.

SUMMARY OF THE INVENTION

An object of the present invention is to provide a dynamic-type semiconductor memory device capable of performing an accurate sensing operation at a high speed.

Another object of the present invention is to provide a semiconductor memory device having an improved power supply line arrangement.

A further object of the present invention is to provide a semiconductor memory device capable of reliably supplying an operation power supply potential and a ground potential to an arbitrary circuit portion.

A semiconductor memory device according to the present invention includes a power supply line in a meshed shape arrangement. A sense amp band is preferably divided into a plurality of groups. More preferably, an equalize circuit is provided for a drive signal line in each group. Preferably, a drive signal is independent in each group, while a sense amp drive signal line is not connected between adjacent sense amp groups.

In addition, with respect to a power supply line located in parallel with a sense amp band, a sense amp drive circuit is arranged for a predetermined number of sense amplifiers in each group.

Sense amplifier groups are preferably driven individually and separately. In this case, an effect of a resistance and a capacitance on a sense amp drive signal line falls only within a group. A drive circuit is provided for a predetermined number of sense amplifiers, wherein a drive signal line is connected to a power supply line arranged in parallel with the sense amp band through the drive circuit. As a result, only a predetermined number of sense amplifiers are connected to the drive signal line in effect, so that a potential distribution in the sense amp drive signal line can be avoided.

In addition, an equalize circuit is also provided for a plurality of sense amplifiers, whereby an equalize/precharge potential can be stably maintained at a desired potential.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 8:
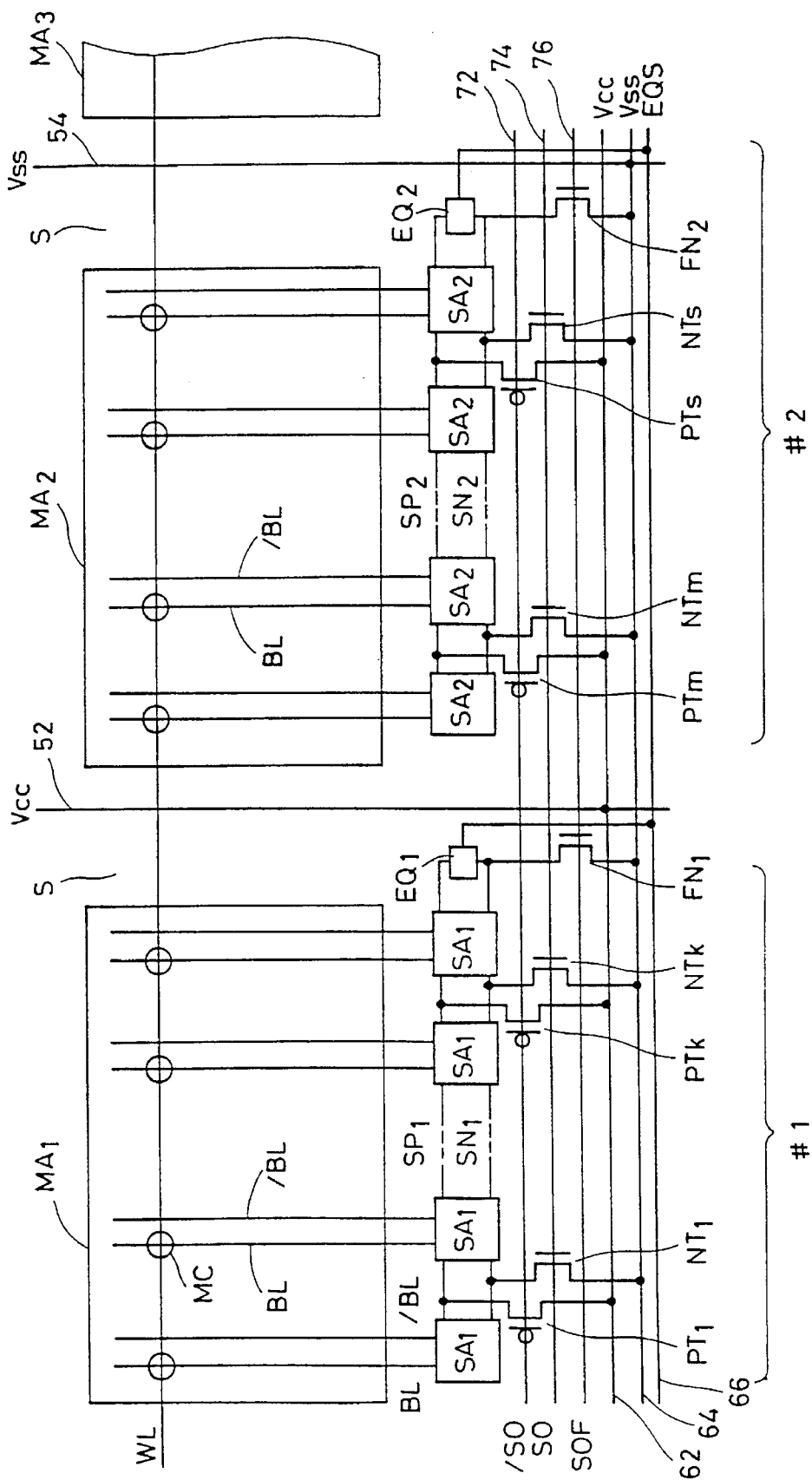
FIG. 8 is a diagram showing an arrangement of a main part of a dynamic-type semiconductor memory device according to one embodiment of the present invention.

FIG. 8 is a diagram showing an arrangement of a main part of a dynamic-type semiconductor memory device according to one embodiment of the present invention. In FIG. 8, a memory cell array is divided into a plurality of sub arrays MA1, MA2, MA3 . . . . Two sub arrays MA1 and MA2 are shown in FIG. 8 as examples. Each of the sub arrays MA1 and MA2 includes a plurality of memory cells MC arranged in rows and columns. A word line WL extends crossing the sub arrays MA1, MA2, MA3 . . . . A word line shunt region S is provided between the sub arrays MA1 and MA2 and a shunt region S is also provided between the sub arrays MA2 and MA3.

Relatively highly resistive polysilicon is generally used for the word line WL. An increase in a storage capacity of a dynamic-type semiconductor memory device is accompanied by an increase in a length of the word line WL. An effect of a resistance and a parasitic capacitance of the word line WL is accordingly increased, thereby making difficult transmission of a word line drive signal from a starting end to a terminating end at a high speed. In order to prevent propagation delay of the drive signal, a metal layer (of aluminum, for example) having a relatively small resistance is provided in parallel with and on the upper of the word line WL. The upper metal layers and the word lines of polysilicon are connected to each other at several points in the memory array. By transmitting a word line drive signal to the upper metal layer, on the a resistance of the word line WL can be effectively reduced, thereby transmitting the word line drive signal from a starting end to a terminating end of the word line WL at a high speed.

The word line WL is arranged to orthogonally cross over the bit lines BL and $\overline{BL}$. The upper metal layer is arranged in an upper position than the bit lines BL and $\overline{BL}$. Therefore, a region (shunt region) at which the upper metal layer and the lower polysilicon word line WL are connected to each other is a region wherein no bit line BL and $\overline{BL}$ are provided, than, is, no memory cell is provided. Thus, the memory cell array is divided into sub arrays and a region between adjacent sub arrays is used as a word line shunt region.

A sense amp band is provided on one side of each of the bit lines BL and $\overline{BL}$. The sense amp band is arranged in parallel with the word line WL. The sense amp band is also divided into groups corresponding to the sub arrays. A sense amplifier SA1 in a sense amplifier group #1 is interconnected to sense amp drive signal lines SP1 and SN1. A sense amplifier SA2 contained in a sense amplifier group #2 is interconnected to sense amp drive signal lines SP2 and SN2. The sense amp drive signal lines SP1 and are completed in the group #1, while the sense amp drive signal lines SP2 and SN2 are completed in the group #2. In other words, sense amp drive signal lines are separated from each other between adjacent sense amplifier groups. An equalize circuit EQ1 is provided for the sense amp drive signal lines SP1 and SN1, while an equalize circuit EQ2 is provided for the sense amp drive signal lines SP2 and SN2. The equalize circuits EQ1 and EQ2 are both provided in corresponding word line shunt regions S.

Power supply lines 52 and 54 are provided in parallel with the bit lines BL and $\overline{BL}$ in the respective word line shunt regions S. The power supply line 52 transmits the operation power supply potential Vcc, while the power supply line 54 transmits the ground potential Vss. An arrangement of the power supply lines 52 and 54 in the word line shunt regions S allows a power supply line with a sufficient line width to be disposed without increasing an chip area, thereby enabling a stable transmission of the power supply potentials Vcc and Vss.

Sense amplifier activation signal transmission lines 72, 74 and 76 are arranged in parallel with the sense amp band. The sense amplifier activation signal transmission line 72 transmits a sense amplifier activation signal $\overline{SO}$, the sense amplifier activation signal transmission line 74 transmits a sense amplifier activation signal SO and the sense amplifier activation signal transmission line 76 transmits a sense amplifier activation signal SOF.

Power supply lines 62 and 64 are disposed in parallel with the sense amplifier activation signal transmission lines 72, 74 and 76. The power supply line 62 transmits the operation power supply potential Vcc and is connected to the power supply line 52. The power supply line 64 transmits the ground potential Vss and is connected to the power supply line 54 provided in the word line shunt region S.

Sense amp drive transistors each are provided corresponding to a predetermined number of sense amplifiers in each of the sense amplifier groups #1, #2 . . . .

FIG. 8 shows, as an example, a pair of drive transistors disposed with respect to two sense amplifiers. More specifically, provided for the sense amplifier SA1 at the left end in FIG. 8 are a drive transistor PT1 responsive to the sense amp activation signal $\overline{SO}$ for connecting the sense amp drive signal line SP1 to the power supply Line 62 and a drive transistor NT1 responsive to the sense amp activation signal SO for connecting the sense amp drive signal line SN1 to the power supply line 64. Similarly, provided for the two sense amp SA1 at the right end in the FIG. 8 of the sense amplifier group #1 are a drive transistor PTk responsive to the sense amp activation signal SO for connecting the sense amp drive signal Line SP1 to the power supply line 62 and a drive transistor NTk responsive to the sense amplifier activation signal SO for connecting the sense amp drive signal line SN1 to the power supply line 64.

Further, for the sense amplifier group #1, provided in the word line shunt region S is a drive transistor FN1 for performing a high sensitivity amplification in a first stage during a two-stage amplification operation by sense amplifiers. The drive transistor FN1 connects the sense amp drive signal line SN1 to the power supply line 64 in response to the sense amp activation signal SOF. The drivability of the drive transistor FN1 is set to be smaller than the total drivability of the drive transistors NT1, . . . NTk.

Similarly in the sense amplifier group #2, arranged for the two sense amplifiers SA2 at the left end of the group #2 are drive transistors PTm and NTm. Provided for the sense amplifier SA2 at the right end of the group #2 are drive transistors PTs and NTs. A drive transistor FN2 as well as the equalize circuit EQ2 is arranged in the word lane shunt region S.

The equalize circuits EQ1, EQ2, . . . are controlled to operate by an equalize signal EQS transmitted in a direction vertical to the bit lines BL and $\overline{BL}$, that is, on a signal lane 66 arranged in a direction parallel to the power supply lines 62 and 64. A signal line for transmitting the precharge potential VBL may be arranged to extend along the word line shunt region or may be arranged in parallel with the power supply lines 62 and 64.

In the arrangement shown in FIG. 8, the power supply lines 52 and 54 are alternately arranged in the word line shunt regions S and in a direction vertical to the word line WL. As a whole, the power supply lines 52 and 54 and the power supply lines 62 and 64 are respectively interconnected (in the word line shunt regions), to make a meshed shape arrangement on the memory cell array. This arrangement enables a stable supply of the power supply potentials Vcc and Vss to an arbitrary position in the memory device. In addition, provision of the power supply lines 52 and 54 of a large width in the word line shunt regions S enables a stable supply of the power sources Vcc and Vss to the power supply lines 62 and 64 even with their widths narrow.

In the afore-described arrangement, the number of sense amplifiers SA connected to one sense amp drive signal line SP lot SN) is effectively two, which reduces a load of the sense amp drive signal line. The sense amp drive signal lines SP and SN (generically denoting SP1, SN1, SP2, SN2, . . . ) are respectively connected to the power supply lines 62 and 64 arranged in parallel thereto through the drive transistors PT and NT (generically denoting PT1, NT1, . . . PTs, NTs, . . . ). In other words, irrespective of a location of the sense amplifiers SA, a distance between the sense amp drive signals SP and SN and the power supply lines 62 and 64 is the shortest and no potential distribution is generated in the respective sense amp drive signal lines SP and SN, so that the power supply potentials Vcc and Vss can be stably supplied in an operation.

It is further possible to arrange an active region (a source or drain region) of the drive transistor NT in parallel with an activation signal transmission line to make a transistor size sufficiently large. That is, it is possible no make a size in a gate width direction sufficiently large, so that the drive transistor NT is allowed to have a sufficient drivability without involving a problem in layout.

In addition, the transistor FN (generically denoting FN1, FN2 . . . ) having a relatively small drivability and operable first in a sense amplifier operation is arranged in the word line shunt region, and the drive transistor FN is provided one for each sense amplifier group. A length of a sense amp drive signal line driven by the drive transistor FN is drastically reduced to avoid variation in discharging time during a sensing operation in the first step depending on the arranged positions of sense amplifiers.

It is also possible to drive the sense amp drive signal line SN and SP at a high speed by the drive transistor NT and PT. This enables high-speed discharging and charging of potentials on the sense amp drive signal lines SP and SN to the power supply potentials Vss and Vcc, thereby allowing a correct sensing operation to be performed at a high speed without generating a potential distribution in the sense amp drive signal line.

Furthermore, since the equalize circuit EQ (generically denoting EQ1, EQ2 . . . ) is provided in each word line shunt region S, the equalize circuit EQ is required to drive the sense amp drive signal lines only in a corresponding sense amplifier group, whereby an equalizing operation can be performed individually in each group. As a result, it becomes possible to reliably equalize and precharge the sense amp drive signal lines SP and SN to a predetermined precharge potential VBL at the time of equalization.

Since the equalize circuit EQ, the drive transistor FN and the power supply lines 52 and 54 are arranged in a word line shunt region, an area penalty is reduced to enable a line width of the power supply lines 52 and 54 to be sufficiently increased and the equalize circuit EQ and the transistor FN to have a sufficiently large size. A stable supply of a desired potential results.

In the arrangement shown in FIG. 8, the signal line 66 for transmitting the equalize signal EQS is located outside of the power supply lines 62 and 64. The signal line 66 may be arranged in proximity to the equalize circuit EQ, that is, may be located between the sense amplifier SA and the sense amp activation signal transmission line 72.

In addition, the power supply lines 52 and 54 are arranged in a word lines shunt regions in the arrangement shown in FIG. 8. It is not necessary to dispose the power supply lines 52 and 54 in each word line shunt regions S, but may be provided in a word line shunt region S at appropriate intervals. The power supply line 52 for transmitting the operation power supply potential Vcc and the power supply line 54 for transmitting a ground potential are alternately arranged in word line shunt regions S. The power supply lines 52 and 54 are not necessarily required to be alternatively arranged, but may be arranged in a different fashion.

Although drive transistors PT and NT are provided each for two sense amplifiers SA, they may be provided for one sense amplifier SA1, or a pair of them may be provided for three or more sense amplifiers SA.

The sense amplifier band is divided into sense amplifier groups corresponding to word line shunt regions S. In other words, the sense amp drive signal lines SP and SN each are separated in the respective word line shunt regions S. However, the drive signal line needs not to be separated in each word line shunt region S, but sense amp drive signal lines SP and SN each may continuously extend through a plurality of word line shunt regions. Furthermore, one sense amp drive signal line SP and one sense amp drive signal line SN may be provided for the entire memory, cell array.

Although the drive transistor FN is arranged corresponding to a word line shunt region S, it is not necessary, to arrange one drive transistor FN corresponding to each wore line shun: region. One or a plurality of drive transistors FN may be provided for a pair of sense amp drive signal lines SN and SP.

In addition, an equalize circuit EQ is disposed for each word line shunt region S in the arrangement shown in FIG. 8. It is only necessary to provide one or a plurality of equalize circuits EQ for a set of sense amplifiers and the drive signal lines SN and SP.

That is, when a sense amp band is divided into a plurality of groups, an equalize circuit EQ and a drive transistor FN may be provided for each group. The sense amplifier group is not necessary to be separated in each word line shunt region S. It is only necessary to have a distance effectively reduced between the sense amp drive signal lines SP and SN and the power supply lines 52 and 54.

Figure 7:
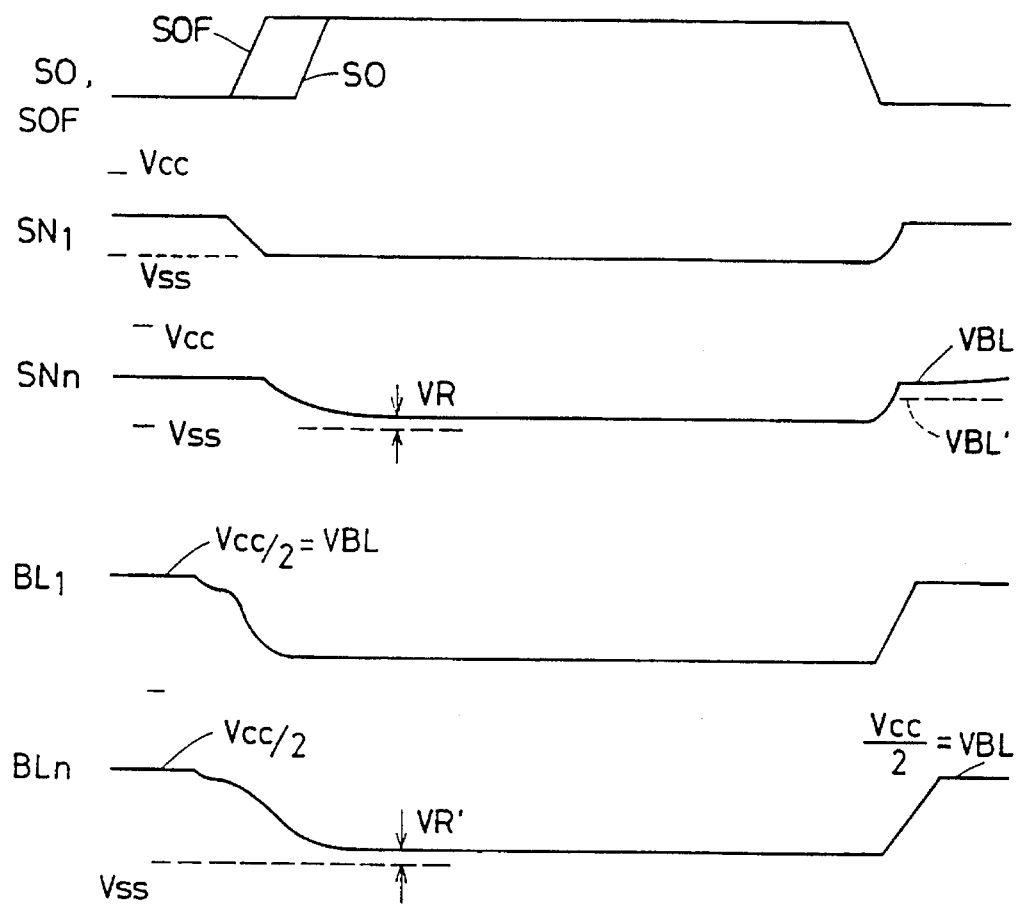
FIG. 7 is a signal waveform diagram illustrating a problem of a conventional dynamic-type semiconductor memory device.

In any arrangement, signal waveforms of the nodes SN1 and SNn are the same to each other in the waveform diagram of FIG. 7 and similarly signal waveforms of the bit lines BL1 and BLn are the same, resulting in no potential distribution. It is therefore possible to carry out an accurate sensing operation at a high speed and to realize equalization of sense amp driving signal lines. A specific layout of a word line shunt region will be described in the following.

Figure 9:
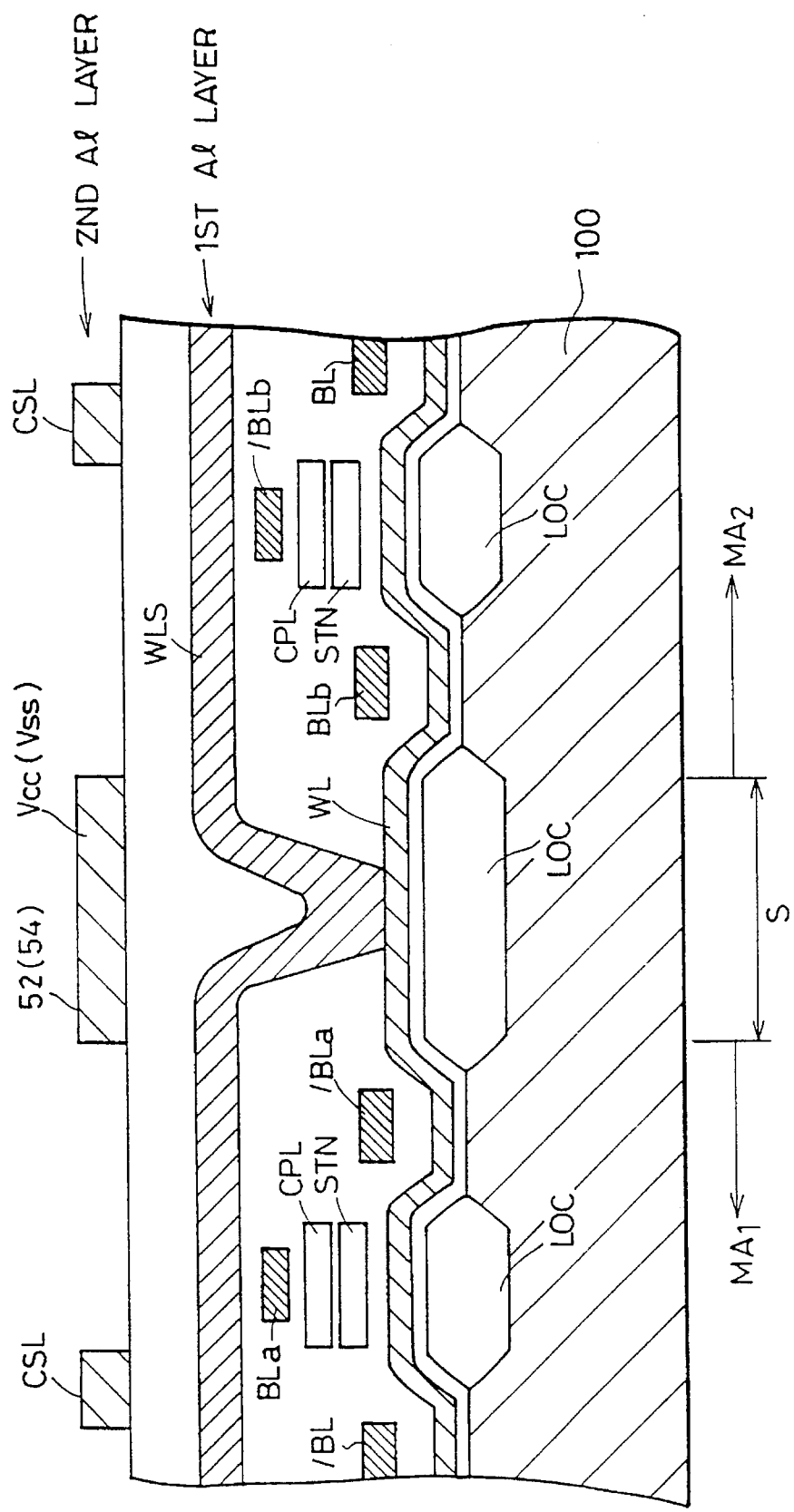
FIG. 9 is a diagram showing a sectional structure of the main part of the structure shown in FIG. 8.

A sectional structure in proximity to a word line shunt region is shown in FIG. 9. The semiconductor memory device is formed on a semiconductor substrate 100. A memory cell region is determined by a LOCOS (Local Oxidation of Silicon) film LOC formed on the surface of the semiconductor substrate 100. Adjacent cells are isolated by the cell isolation film LOC. A word line WL of polysilicon is disposed on the surface of the semiconductor substrate 100. Formed in parallel with the word line WL is a first metal layer WLS of, for example, aluminum with a low resistance. The second word line WLS with a low resistance and the first word line WL with a high resistance are connected to each other on the cell isolation film LOC. Such region provides a word line shunt region S.

Bit lines BL and $\overline{BL}$ are both formed of a second polysilicon layer. A bit line BLa and a complementary bit line $\overline{BLa}$ are paired and similarly, a bit line BLb and a bit line BLb are paired. Arranged between the bit line BLa and the word line WLS on the cell isolation film LOC are a storage node STN and a cell plate CPL constituting a memory capacitor. The storage node STN is connected to a drain of a transfer gate and the cell plate CPL is supplied with a fixed potential (an intermediate potential of Vcc/2, for example).

Further provided on the second word line WLS is a power supply line 52 or 54 of a second level interconnection, that is, a second level aluminum layer. The second level aluminum layer also provides a column selection line CSL for transmitting a column selection signal from a column decoder. The column selection line CSL, the power supply line 52 (or 54) and the bit lines BL and $\overline{BL}$ are arranged to be orthogonal to the word lines WL and WLS.

As shown in FIG. 9, by arranging the power supply line 52 (or 54) in the word line shunt regions, a sufficient line width can be ensured without an area penalty, thereby achieving a stable transmission of a desired power supply potential Vcc (or Vss). The column selection signal transmission line CSL shown in FIG. 9 will be described in more detail later.

Figure 10:
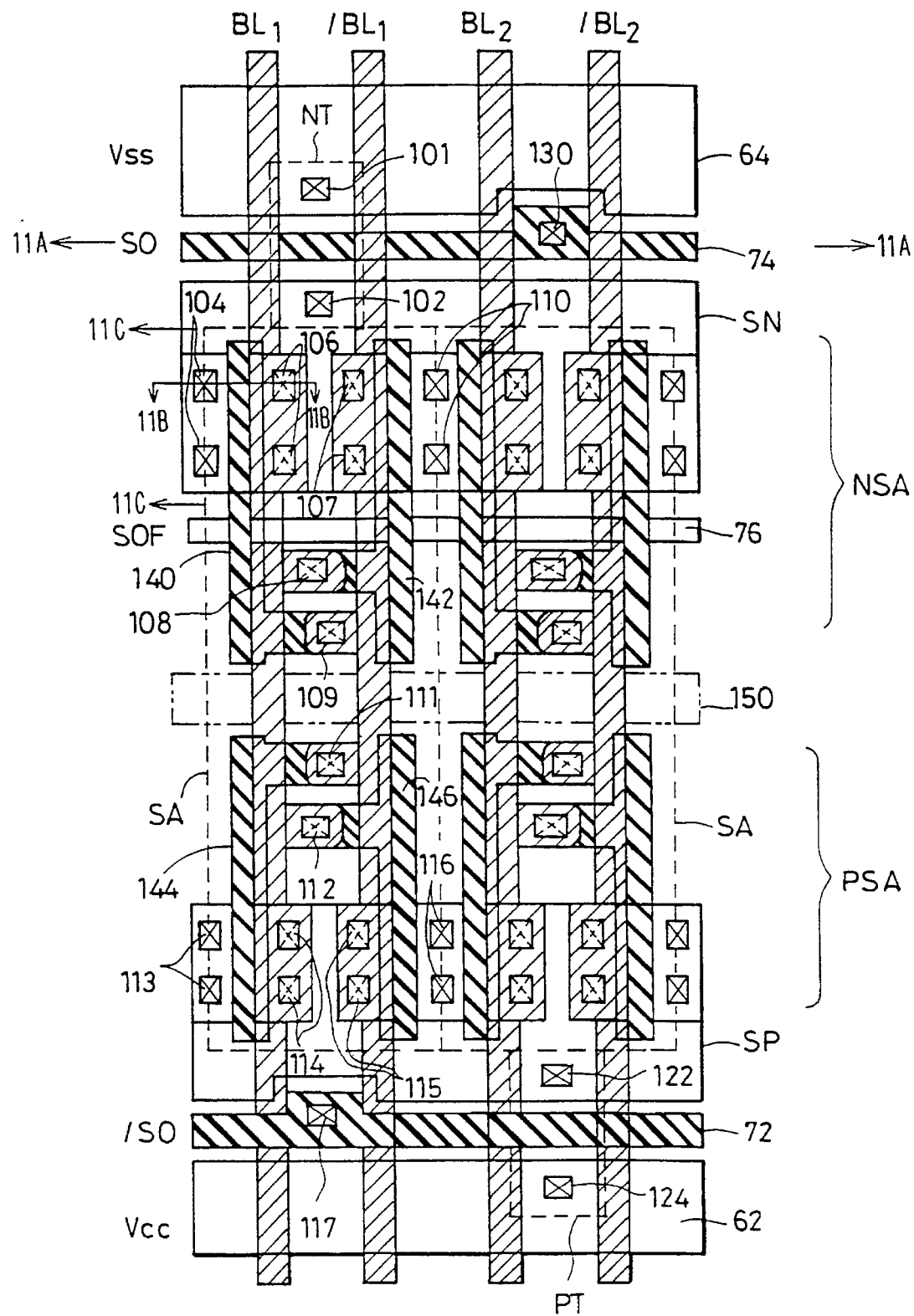
FIG. 10 shows a layout of a sense amplifier portion shown in FIG. 8.

FIG. 10 is a diagram showing a layout of a part of a sense amplifier. In FIG. 10, bit lines BL1, $\overline{BL1}$, BL2 and $\overline{BL2}$ formed of a first interconnection layer of first polysilicon, for example, are arranged in parallel with each other in a vertical direction of FIG. 10. A first metal interconnection layer 64 of aluminum, for example, is arranged in a direction orthogonal to the bit lines BL1, $\overline{BL1}$, BL2 and $\overline{BL2}$. The power supply line 64 transmits a ground potential Vss.

A sense amp activation signal transmission line 74 for transmitting sense amp activation signal SO is formed of a second interconnection layer of second polysilicon in parallel with the power supply line 64. A sense amp drive signal line SN is formed of a first level aluminum interconnection to be in parallel with the sense amp activation signal transmission line 74. A signal line 76 of the first Level aluminum interconnection layer for transmitting the sense amp activation signal SOF is provided in parallel with the sense amp drive signal line SN.

Further provided is a sense amp drive signal line SP for driving a P channel sense amplifier in a direction orthogonal to the bit lines BL1, $\overline{BL1}$, BL2 and $\overline{BL2}$, which signal line is formed of the first level aluminum interconnection layer. An interconnection layer 72 of a polysilicon layer is formed in parallel with the sense amp drive signal line SP. The interconnection layer 72 transmits the sense amp activation signal $\overline{SO}$. Further provided in parallel with the signal line 72 is a signal line 62 made of the first level aluminum interconnection layer for transmitting the operation power supply potential Vcc.

A drive transistor NT has a source connected to the signal line 64 through a contact hole 101 and a drain connected to the signal line SN through a contact hole 102. The gate of the transistor NT is formed of the signal line 74. The signal line 74 is formed of the first polysilicon Layer. With an increase in an interconnection of the signal line 74, a resistance thereof is increased. Therefore, similarly to the word line shunt arrangement, a first level metal layer (a first aluminum layer) is provided in parallel with and on the interconnection layer 74 to connect the signal line 74 with the upper metal interconnection layer through a contact hole 130.

The transistor NT is provided between the bit lines BL1 and $\overline{BL1}$. The contact hole 130 is formed between the bit lines BL2 and $\overline{BL2}$. The following is the reason why the transistor NT is formed between the bit lines BL1 and $\overline{BL1}$. In consideration of a balance of a capacitance distribution between the bit lines BL1 and $\overline{BL1}$ during an operation of a sense amplifier, parasitic capacitances of the bit lines SL1 and $\overline{BL}$ are set to be equally affected by the transistor NT. Based on the same idea, the contact hole 130 is formed between the bit lines BL2 and $\overline{BL2}$. Therefore, an N channel sense amp drive transistor NT is provided for every other pair of bit lines.

Figure 1:
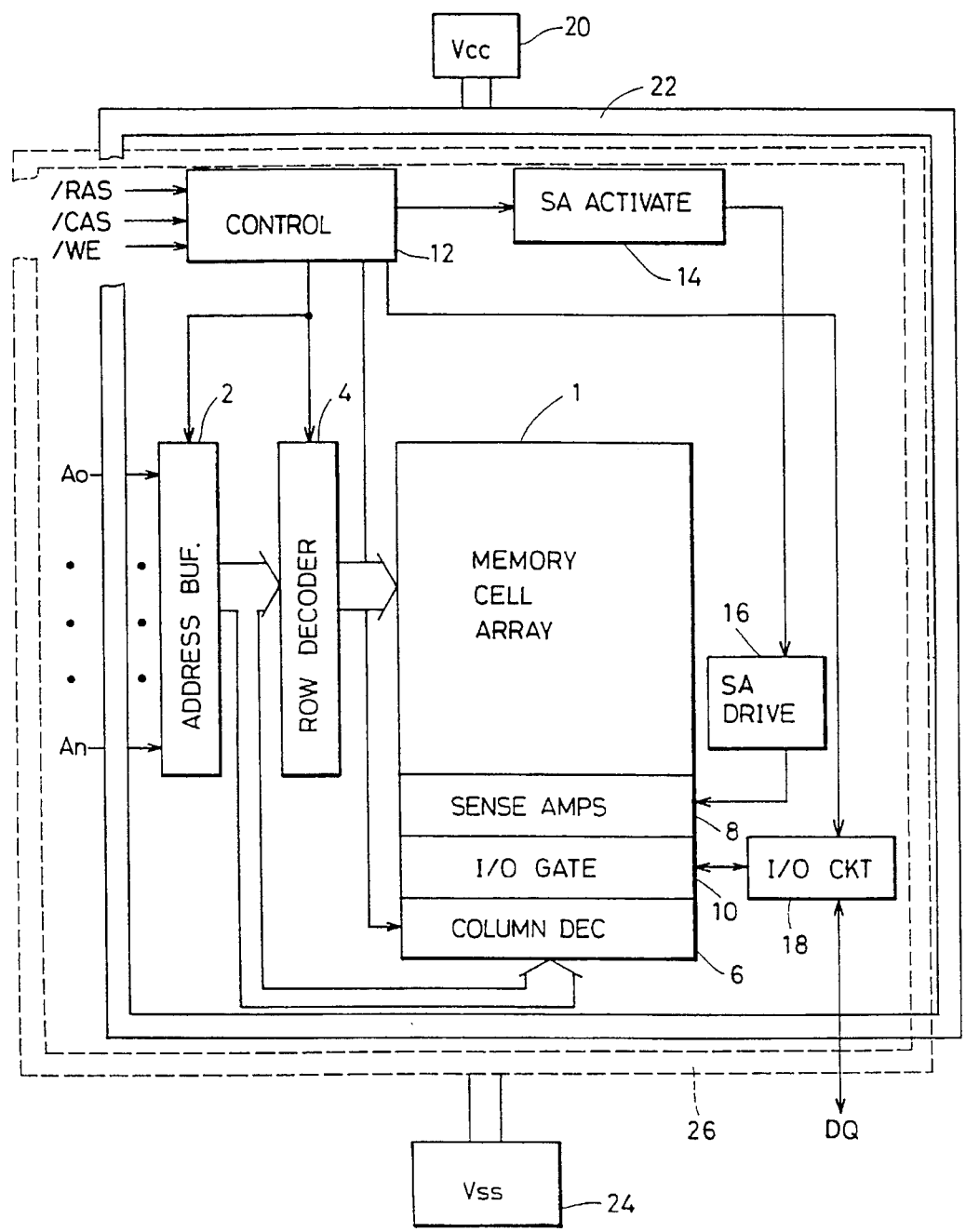
FIG. 1 schematically shows an entire arrangement of a conventional dynamic-type semiconductor memory device.
Figure 2:
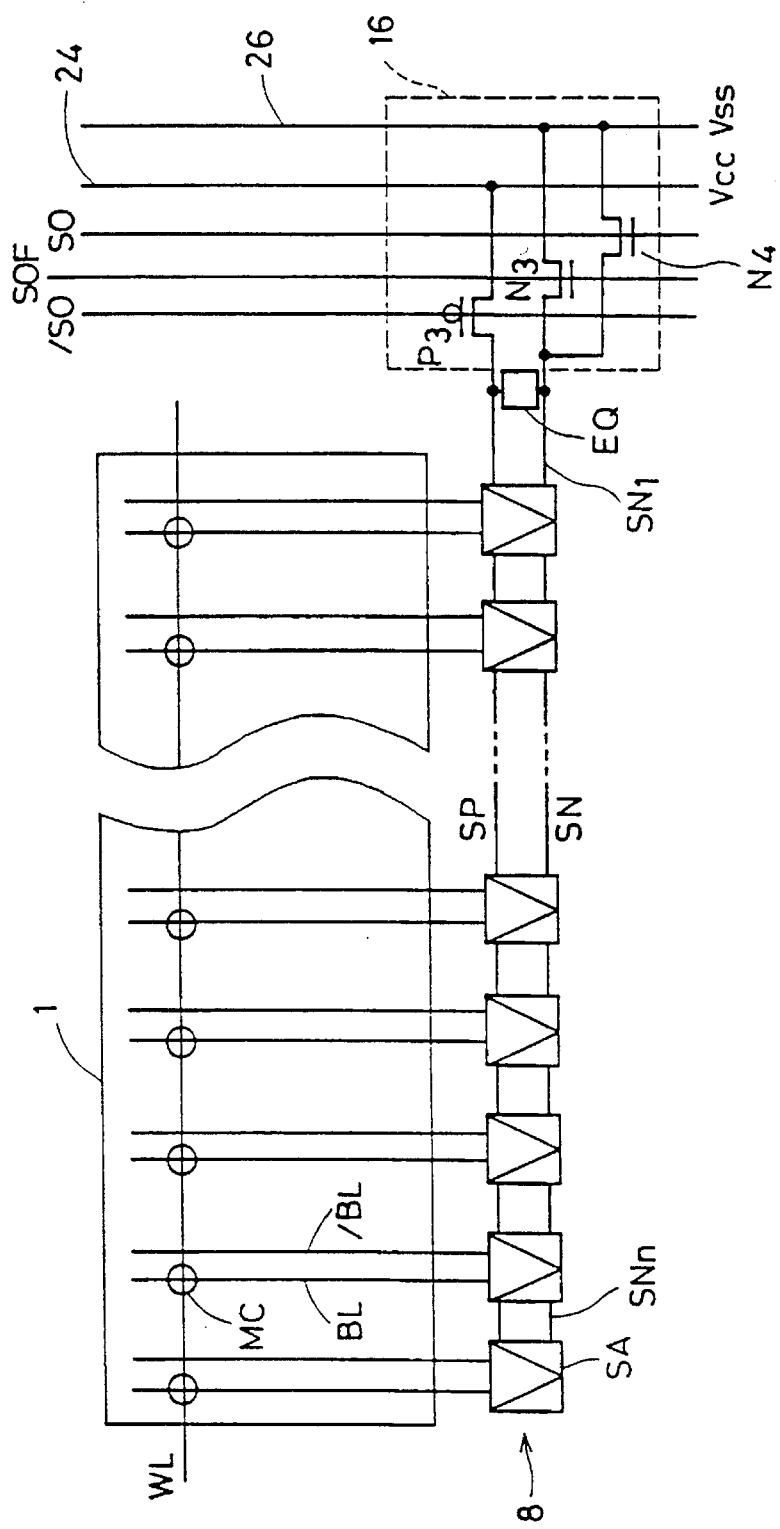
FIG. 2 shows an example of an arrangement of the periphery of a sense amp band in a conventional dynamic-type semiconductor memory device.
Figure 3:
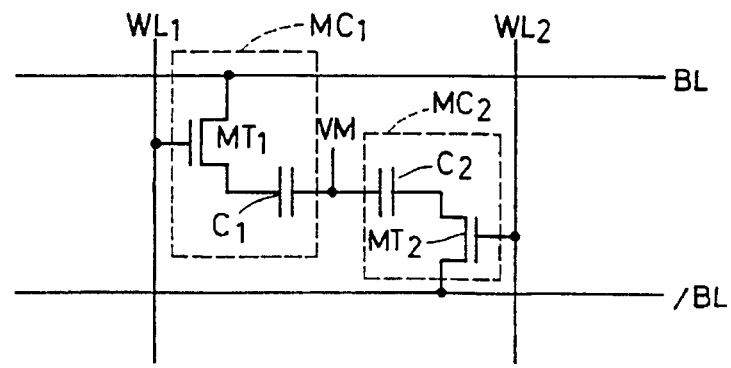
FIG. 3 shows a structure of a memory cell in a conventional dynamic-type semiconductor memory device.
Figure 4:
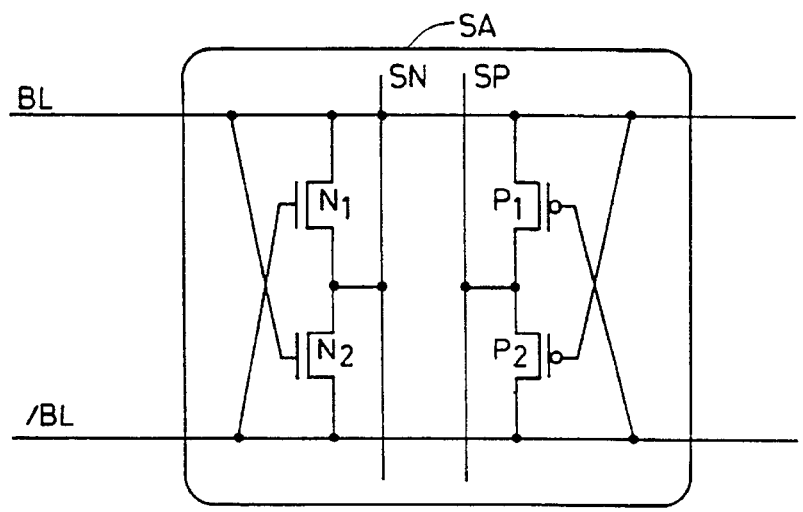
FIG. 4 shows an arrangement of a conventional sense amplifier.
Figure 5:
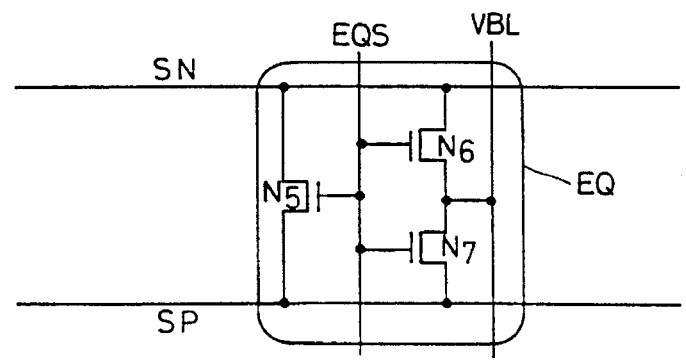
FIG. 5 shows an arrangement of conventional sense amp drive signal line and equalize circuit.
Figure 6:
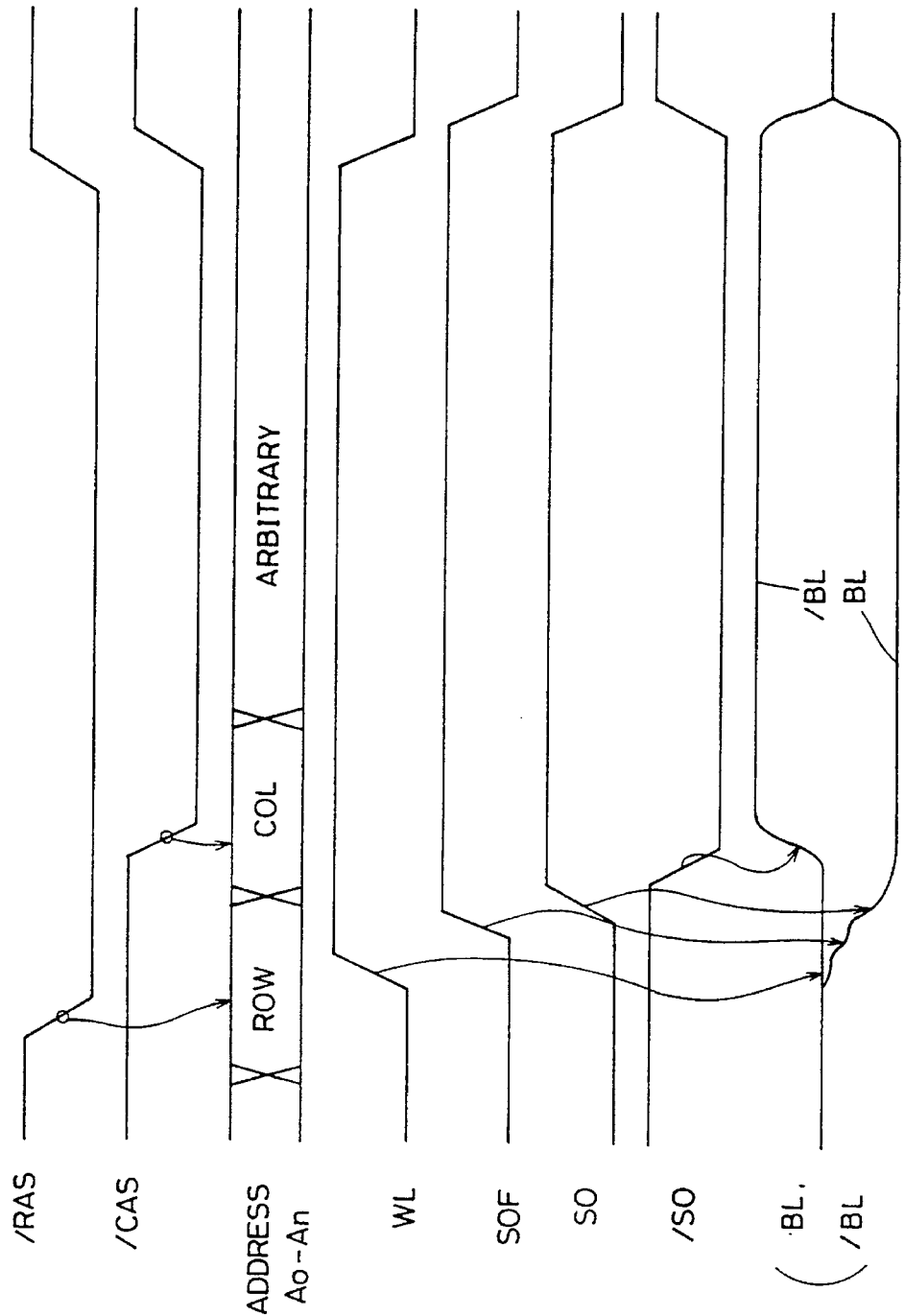
FIG. 6 is a signal waveform diagram showing operation of a conventional dynamic-type semiconductor memory device.

Cross-coupled N channel MOS transistors between the bit lines BL1 and $\overline{BL1}$ and between the bit lines BL2 and $\overline{BL2}$ are formed under the sense amp drive signal line SN made of the first level aluminum interconnection layer. In one sense amplifier, the transistor N1 (see FIG. 4) has a source connected to the signal line SN through a contact hole 104 and a drain connected to the bit line BL1 through a contact hole 106. The gate of the transistor N1 is formed of the signal line 140 made of a second polysilicon layer. The signal line 140 is connected to the bit line $\overline{BL1}$ of the first polysilicon layer through a contact hole 109.

The other transistor N2 (see FIG. 4) has a drain connected to the bit line $\overline{BL1}$ through a contact hole 107 and a source connected to the drive signal line SN through a contact hole 110. The gate of the transistor N2 is formed of the signal line 140 of the second polysilicon layer. A signal line 142 is connected to the bit line BL1 through a contact hole 108. Herein, the signal line 74, and the signal lines 140 and 142 respectively forming gates of the transistors N1 and N2 are made of a second polysilicon layer, the second polysilicon layer being located at a position lower than the first polysilicon layer.

An N channel sense amplifier region NSA and a P channel sense amplifier region are isolated from each other by an isolation region 150. In the P channel sense amplifier PSA, the transistor P1 (see FIG. 4) is connected to the bit line BL1 through a contact hole 114 and has a source connected to the drive signal line SP through a contact hole 113. The gate of the transistor P1 is formed of the interconnection layer 144 of the second polysilicon layer. The interconnection layer 144 is connected to the bit line $\overline{BL1}$ through a contact hole 111. The transistor P2 has a drain connected to the bit line $\overline{BL1}$ through a contact hole 115 and a source connected to the sense amp drive signal SP through a contact hole 116. The gate of the transistor P2 is formed of an interconnection layer 146 of the second polysilicon layer. The interconnection layer 146 is connected to the bit line BL1 through a contact hole 112.

The drive transistor PT for driving the P channel sense amplifier PSA is formed between the bit lines BL2 and $\overline{BL2}$. The transistor PT has a drain connected to the drive signal line SP through a contact hole 122 and a source connected to the power supply line 122 through a contact hole 124. The gate of the transistor P2 is formed by the signal Line 72. The signal line 72 is formed of the second polysilicon layer. The polysilicon layer has a large resistance and causes a signal propagation delay as the interconnection length is increased. Therefore, the first level aluminum interconnection layer is arranged at an upper level layer of and in parallel with the signal line 72. The upper level interconnection layer with a low resistance and the lower level signal line 72 are connected to each other through a contact hole 117. The contact hole 117 is formed between the bit lines BL1 and $\overline{BL1}$.

As shown in FIG. 10, by forming one drive transistor NT between the bit lines BL1 and $\overline{BL1}$ and the other drive transistor PT between the bit lines BL2 and $\overline{BL2}$, the drive transistors can equally exert an effect in a capacitance sense on the bit lines BL1 and $\overline{BL1}$, and also on BL2 and $\overline{BL2}$.

Similarly, by arranging the contact holes 130 and 117 between bit lines of different bit line pairs, it is possible to provide the same bit line capacitance distribution.

A sense amplifier provided for the bit lines BL2 and $\overline{BL2}$ has the same arrangement as that of a sense amplifier provided for the bit lines BL1 and $\overline{BL1}$. As described in the foregoing, by forming interconnection layers in a multilayer structure, each interconnection layer can be arranged without increasing an area of a sense amp drive signal line in a sense amplifier region.

As the alternative of the arrangement shown in FIG. 10, the drive transistor NT may be provided between the bit lines BL2 and $\overline{BL2}$ and the other drive transistor PT may be provided between the bit lines BL1 and $\overline{BL1}$.

The respective contact regions 130 and 117 of the signal lines 72 and 74 formed of the second interconnection layer (second polysilicon layer) may be modified according to an arrangement of the drive transistors NT and PT. It is only necessary to implement the same capacitance distribution of the bit lines BL1 and $\overline{BL1}$ and the bit Lines BL2 and $\overline{BL2}$.

Although the signal line 76 for transmitting the signal SOF for activating the first sensing operation is formed of the first metal interconnection layer, no drive transistor FN provided in a shunt region is shown in the layout of FIG. 10. Only the interconnection layer (signal line) 76 is illustrated.

Figure 11A:
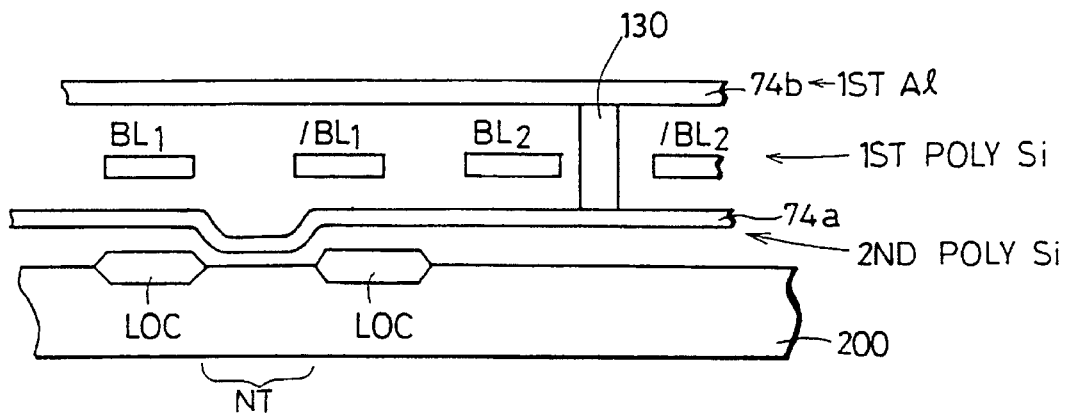
FIGS. 11A to 11C show a sectional structure of the layout shown in FIG. 10.

FIG. 11A is a diagram showing a sectional structure of the sense amplifier taken along line 11A–11 A of FIG. 10. With reference to FIG. 11A, a cell isolation film LOC formed on a surface of a semiconductor substrate 200 defines a drive transistor NT region. Bit lines BL1 and $\overline{BL1}$ of a first polysilicon layer are arranged on the cell isolation film LOC. A signal line 74a of a second polysilicon layer is disposed at the lower layers of the bit lines BL1 and $\overline{BL1}$ and bit lines BL2 and $\overline{BL2}$. A signal line 74b of a first aluminum layer is arranged in parallel with the signal line 74a on the bit lines BL1, BL2, $\overline{BL1}$ and $\overline{BL2}$. Signal lines 74b and 74a are interconnected with each other at a contact hole 130 to provide the signal line 74, so that a resistance of the signal line 74 can be reduced.

Figure 11B:
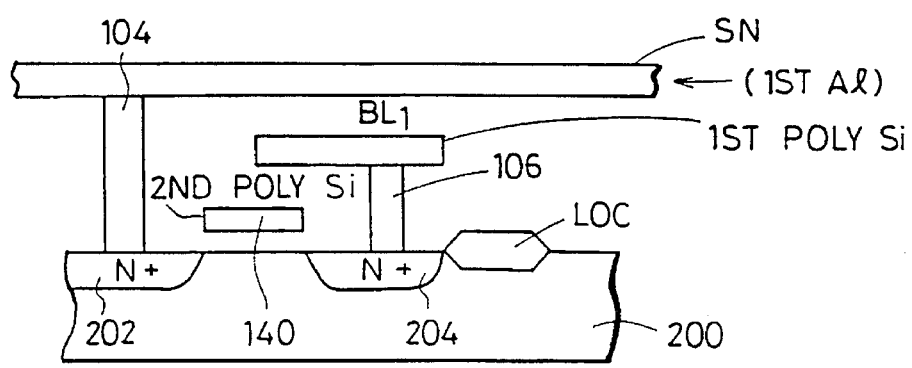

FIG. 11B is a diagram showing a sectional structure of the sense amplifier of FIG. 10 taken along line B—B. Shown is a sectional structure of the transistor N1 (see FIG. 4) in the N channel sense amplifier NSA. Impurity regions 202 and 204 formed on the surface of the semiconductor substrate 200 and a signal line 140 constitute the transistor N1. The signal line 140 is formed of a second polysilicon layer. The impurity diffusion layer 202 is connected to the drive signal line SN of the first aluminum layer at a contact hole 104. The other impurity region 204 is connected to the bit line BL1 of the first polysilicon layer through a contact hole 106.

Figure 11C:
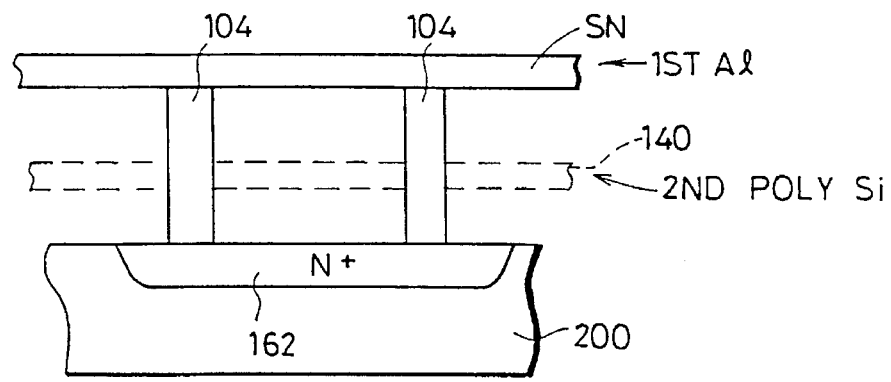

FIG. 11C is a diagram showing a sectional structure of the sense amplifier of FIG. 10 taken along line 11C—11C. In FIG. 11C, an impurity region (source region) 162 of the transistor N1 is connected to the signal line SN of the first aluminum layer through the contact hole 104. The broken line denotes the signal line 140 in FIG. 11C. The signal line 140 is formed of the second polysilicon layer. The reason why two contact holes are made for the transistor N1 is to reliably obtain contact and theoretically, only one contact hole may be used to connect the impurity region 162 to the signal line SN.

In the above-described arrangement of the embodiment, the power supply line (Vcc line and Vss line) arranged in parallel with the bit lines BL and $\overline{BL}$ is located in a word line shunt region. However, such an arrangement is also possible to produce the same effect that no power supply line is provided in a word line shunt region. Such arrangement will be described in the following.

Figure 12:
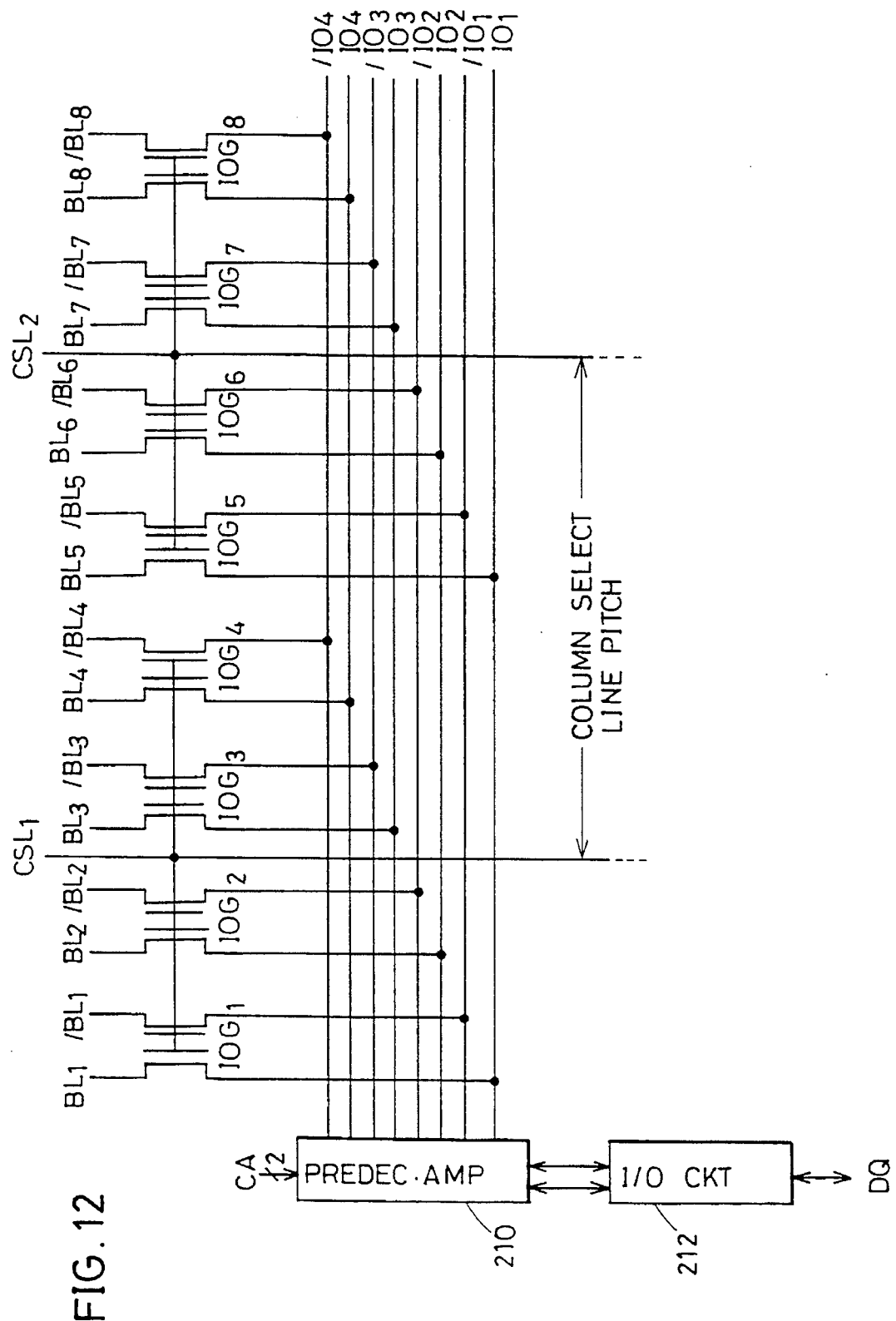
FIG. 12 is a diagram showing an arrangement of an I/O gate portion of a dynamic-type semiconductor memory device to which the present invention is applied.

FIG. 12 is a diagram showing a structure of an I/O gate portion of a dynamic-type semiconductor memory device for use in the second embodiment of the present invention. In FIG. 12, a column selection signal line CSL simultaneously renders four pairs of bit lines selected. In other words, a column selection signal line CSL1 simultaneously selects bit line pairs of BL1 and $\overline{BL1}$, BL2 and $\overline{BL2}$, BL3 and $\overline{BL3}$, and BL4 and $\overline{BL4}$. The bit line paris of BL1 and $\overline{BL1}$ to BL4 and $\overline{BL4}$ are respectively connected to internal data transmission line pairs of IO1 and $\overline{IO1}$ to IO4 and $\overline{IO4}$.

A column selection line CSL2 simultaneously renders bit line pairs of BL5 and $\overline{BL5}$, BL6 and $\overline{BL6}$, BL7 and $\overline{BL7}$, and BL8 and $\overline{BL8}$ selected. The bit line pairs of BL5 and $\overline{BL5}$ to BL8 and $\overline{BL8}$ are respectively connected to the internal data transmission lines of IO1 and $\overline{IO1}$ to IO4 and $\overline{IO4}$. Four pairs of internal data transmission line pairs of IO1 and $\overline{IO1}$ to IO4 and $\overline{IO4}$ are respectively connected to a predecoder amplifier 210. The predecoder amplifier 210 receives a 2-bit column address signal CA, for example, to select one pair out of the four internal data transmission line pairs including IO1 and $\overline{IO1}$ to IO4 and $\overline{IO4}$. The predecoder amplifier 210 is connected to an input/output circuit (I/O circuit) 212. The input/output circuit 212 inputs and outputs data on a bit basis from/to the outside of the device.

A predecoding system of FIG. 12 in which column selection is carried out in the two stages of a bit line pair selection and an internal data transmission line selection is adopted for reducing a column decoder size and a decode signal line and facilitating a column selection signal line arrangement. As shown in FIG. 12, one column selection signal line CSL is arranged corresponding to four pairs of bit lines. There exit four pairs of bit lines BL3 and $\overline{BL3}$ to BL6 and $\overline{BL6}$ between the column selection signal line CSL1 and the adjacent column selection signal line CSL2. Since a pitch of the column selection signal line is sufficiently large, the column selection signal line can be formed to have an enough line width to enable the I/O gate to be selected at a high speed. Herein, the I/O gate includes IO transistors IOG1–IOG8 respectively provided for the bit line pairs of BL1 and $\overline{BL}$ to BL8 and $\overline{BL8}$. A rise of a signal an the column selection signal line CSL turns on the IO gate, thereby connecting the four pairs of bit lines to the respective internal data transmission line pairs.

The column selection signal lines having a pitch corresponding to the four pairs of bit lines are arranged at sufficient spacing. Such spaces can be used.

Figure 13:
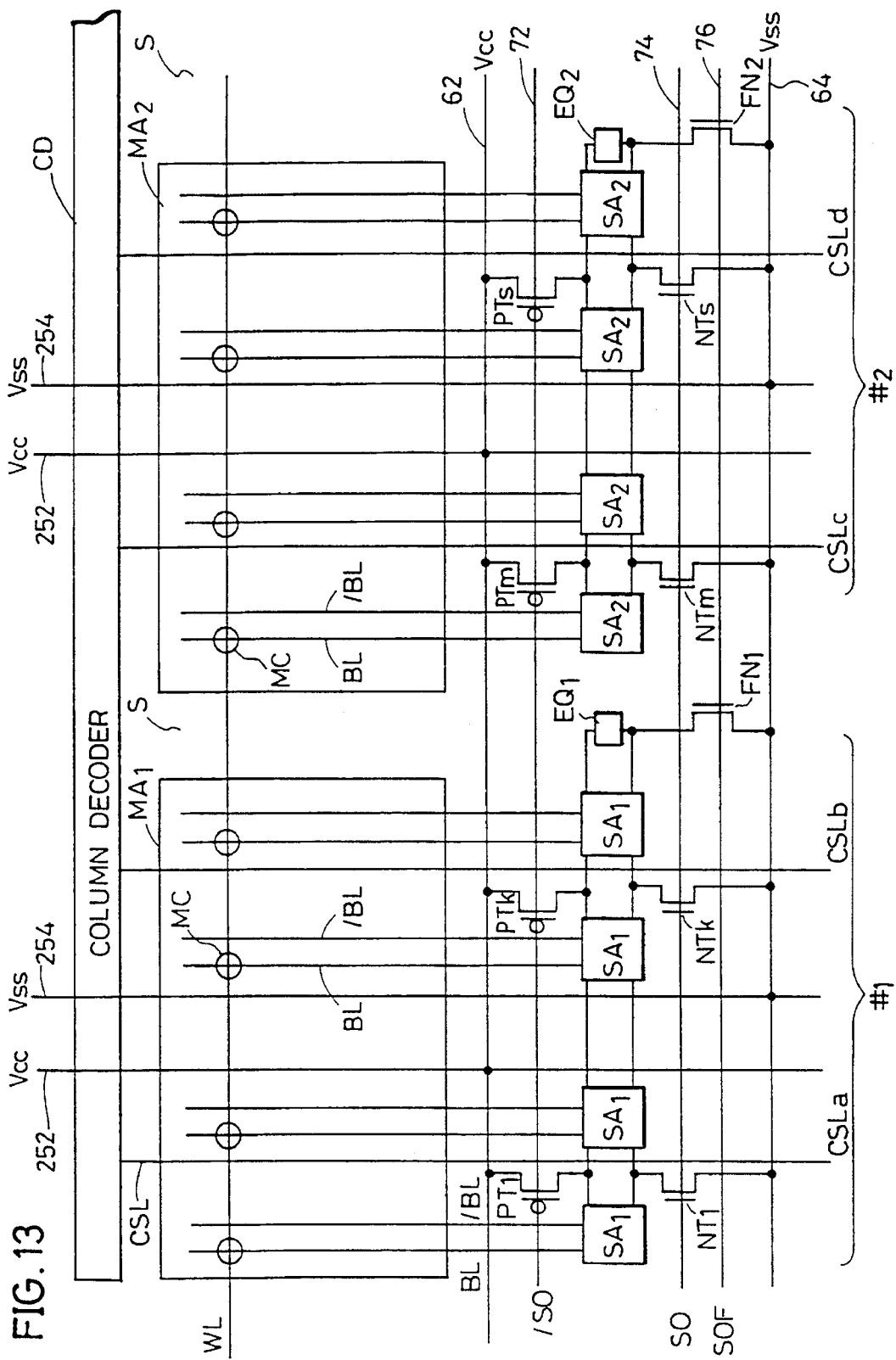
FIG. 13 is a diagram showing an arrangement of a main part of a semiconductor memory device according to another embodiment of the present invention.

FIG. 13 is a diagram showing a structure of a main part of a dynamic-type semiconductor memory device according to another embodiment of the present invention. In the structure shown in FIG. 13, a sense amp band is divided into a plurality of sense amplifier groups similarly to the structure shown in FIG. 8. Like FIG. 8, two sense amplifier groups #1 and #2 are illustrated as an example in FIG. 13. Each structure of the sense amplifier groups is the same as that shown in FIG. 8 and to the corresponding portions are allotted the same reference numerals.

A column decoder CD is provided in parallel with a word line WL. A column selection signal from the column decoder CD is transmitted onto a column selection signal line CSL. The column selection signal line CSL is provided one for four pairs of bit lines as described above. The column selection signal line is formed of a second level aluminum interconnection. Power supply lines 252 and 254 of a second level aluminum interconnection layer are disposed in parallel with bit lines BL and $\overline{BL}$ and between adjacent column selection signal lines CSLa and CSLb and between adjacent column selection signal lines CSLc and CSLd. The power supply lines 252 and 254 are connected to power supply lines 62 and 64 of a first level aluminum interconnection layer crossing with the bit lines, respectively.

An equalize circuit EQ is provided corresponding to each sense amplifier group. A signal line for transmitting an equalize signal EQS for the equalize circuit EQ (EQ1 and EQ2) is formed of a first level aluminum interconnection layer (not clearly shown in the figure). The equalize signal line is disposed in a direction orthogonal to the bit lines BL and $\overline{BL}$. A drive transistor FN (FN1, FN2, . . . ) for performing a first sensing operation is provided in a word line shunt region.

Sense amplifier activation signal transmission lines 72, 74 and 76 are disposed in a direction orthogonal to the bit lines BL and $\overline{BL}$ and formed of the first level aluminum interconnection layer.

As described above, the pitch of the column selection signal lines CSL is sufficiently large. Therefore, it is possible to dispose the power supply lines 252 and 254 of a second level aluminum interconnection layer with a sufficient line width between the column selection signal lines. As a result, reliable and stable transmission of the power supply potentials Vcc and Vss is possible without paying an area penalty. The other structure and operation are the same as those shown in FIG. 8.

As desired in the foregoing, by disposing the power supply lines 252 and 254 in a direction parallel to the bit lines by using the second level aluminum interconnection layer and connecting the power supply lines 252 and 254 to the power supply lines 62 and 64 disposed in a direction orthogonal to the bit lines through a contact hole, potentials on the power supply lines 62 and 64 required for driving sense amplifiers can be stabilized.

In the structure shown in FIG. 13, two power supply lines for interconnecting the operation power supply potential Vcc and the ground potential Vss are arranged between adjacent column selection signal lines. One power supply line, instead of two, may be disposed.

In addition, in grouping the sense amplifiers, it is not necessary to provide a group for each shunt region as is done in the structure shown in FIG. 8.

Also in the structure shown in FIG. 13, the power supply lines are arranged in a meshed shape, so that stable supply of the power supply potentials Vcc and Vss to a desired circuit portion is possible, thereby realizing a stable and high-speed sensing operation.

Figure 14:
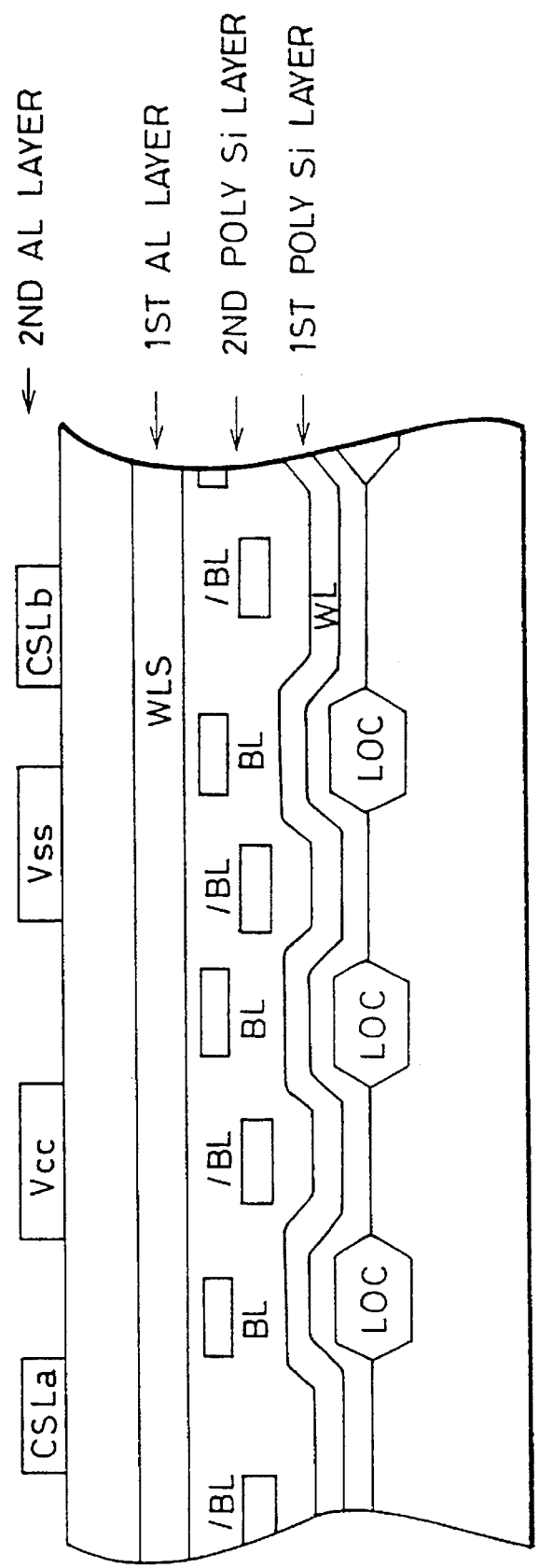
FIG. 14 is a diagram showing a sectional structure of a main part of the arrangement shown in FIG. 13.

FIG. 14 shows a sectional structure of the memory cell array portion having the arrangement shown in FIG. 13. A word line shunt region is not illustrated in FIG. 14. A structure in a memory sub array is shown. As is clearly seen from FIG. 14, by forming a signal line for transmitting the power supply potentials Vcc and Vss by a second level aluminum interconnection layer, a multi-layer to structure with the first level aluminum layer can be obtained, and the power supply lines Vcc and Vss can be disposed in a direction parallel to the bit lines without adversely affecting a layout of the interconnection of the sense amplifier activation signal transmission lines 72, 74 and 76 (all of which are formed of the first level aluminum interconnection layer).

As can be seen from FIG. 14, a spacing between the column selection signal lines CSLa and CSLb is large enough to form the power supply lines Vcc and Vss having a sufficient line width, whereby a power supply line with a low resistance can stably supply a desired potential. Bit lines BL and $\overline{BL}$ formed of a second level polysilicon layer are also illustrated in FIG. 14.

Figure 15:
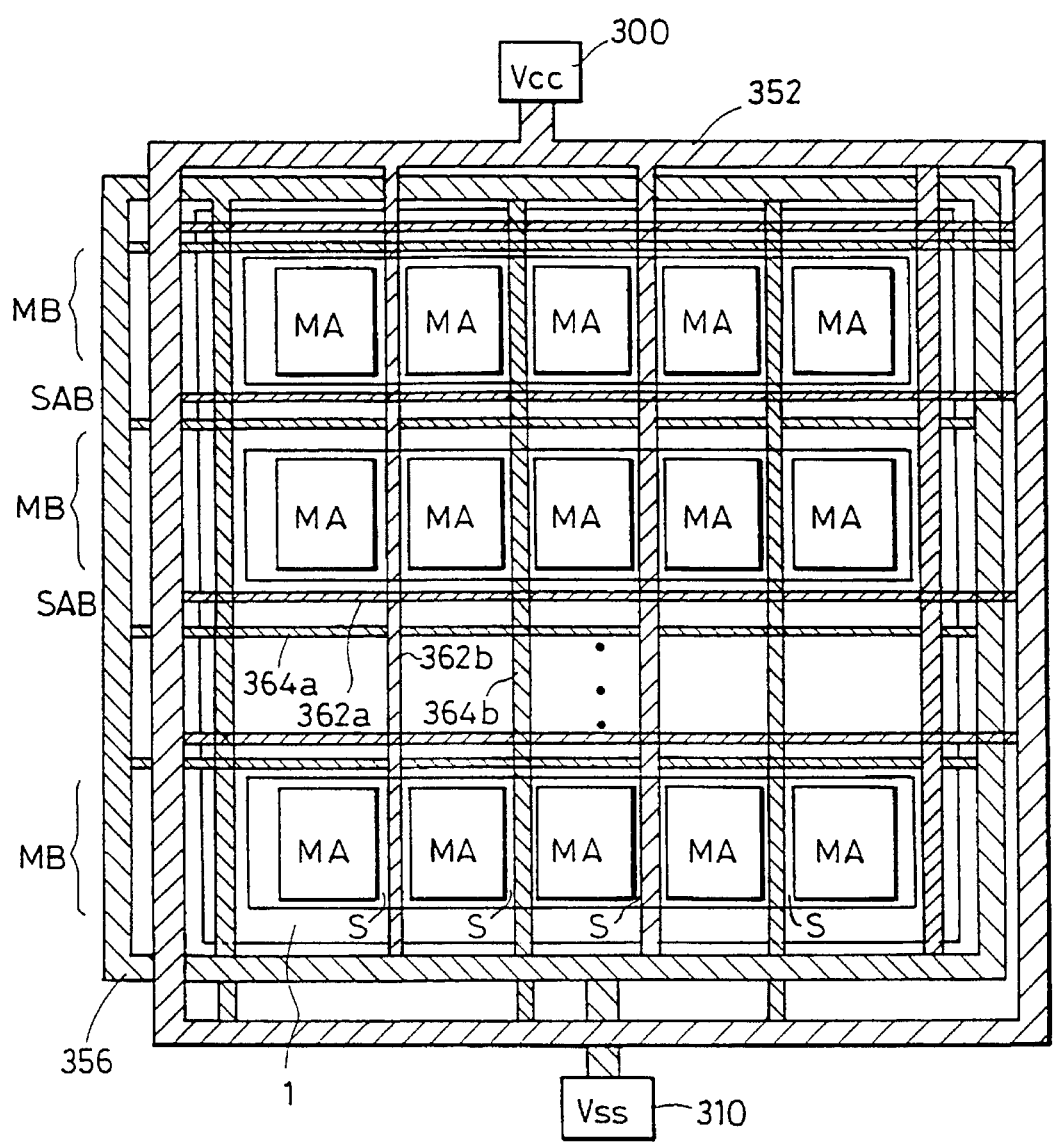
FIG. 15 is a diagram schematically showing an entire arrangement of a semiconductor memory device according to a further embodiment of the present invention.

FIG. 15 is a diagram schematically showing the entire structure of a semiconductor memory device according to a further embodiment of the present invention. In FIG. 15, an operation Dower supply potential Vcc from a pad 300 for receiving the potential Vcc is transmitted onto a main power supply line 352. The power supply line 352 is disposed to surround a memory cell array 1. A pad 310 for receiving a ground potential Vss is connected to a main ground line 356. The main ground line 356 is also arranged to surround the memory cell array 1. The power supply lines 352 and 356 are connected to cross over with each other at a crossing. The power supply lines 352 and 356 are formed by the same level interconnection layer.

With an increase in capacity of a semiconductor memory device, a memory cell array is divided into a plurality of row blocks MB. In other words, the memory array is divided into a plurality of blocks in a column direction (a vertical direction in the figure). In operation, only one row block (a block of a plurality of memory sub arrays MA disposed in a horizontal direction in FIG. 15) is selected to operate. The remaining non-selected blocks remain in a stand-by state. Such divisional block arrangement (partial activation system) achieves a semiconductor memory device with a large storage capacity and low power consumption. Also in such a semiconductor memory device with a large capacity, a word line shunt region S is provided between sub arrays MA in each row block MB. A sense amp band SAB is arranged between adjacent row blocks MB. Also in this case, similarly no the previous embodiments, power supply lines can be arranged in a meshed shape. In FIG. 15, power supply lines 362b and 364b are disposed in the word line shunt region S along a vertical direction so as to have a sufficient line width. On the other hand, a line width of power supply lines 362a and 364a disposed in parallel with a word line extending direction (a row block extending direction) in the sense amp band SAB may be relatively small. The mower supply lines 362a and 362b are connected to the main power supply line 352, while the power supply lines 364a and 364b are connected to the main ground line 356.

By connecting the power supply lines 362 and 364 to the main power supply lines 352 and 354, respectively, the power supply potentials Vcc and Vss can be stably supplied to each circuit portion of the semiconductor memory device.

In the structure shown in FIG. 15, the power supply lines 362b and 364b extending in the vertical direction are provided in the word line shunt region S. The power supply lines 362b and 364b may be provided between the column selection signal transmission lines CSL from the column decoder.

A sense amplifier included in the sense amp band SAB may have a shared sense amplifier structure wherein a sense amplifier is shared by adjacent row blocks. In the shared sense amplifier structure, only a row block including a selected word line out of the sharing row blocks is connected to the sense amplifier and the other is separated from sense amplifiers to maintain a stand-by state. In an independent row block not related to the selected row block, no selecting operation is carried out and no sense amplifier operates, to maintain a stand-by state. A meshed shape arrangement of power supply lines allows even such a structure to drive a sense amplifier at a high speed and realize a stable sensing operation.

Furthermore, in the meshed shape arrangement, the power supply lines 362a and 364a may be used as operation power supply potentials for not only a sense amp band but also for any other circuit portions.

The power supply potential Vcc to be transmitted to the main power supply line 352 may not be equal to the power supply potential to be applied to the pad 300 but may be an internal down-converted voltage (from 5 V to 3.5 V, for example).

Figure 16:
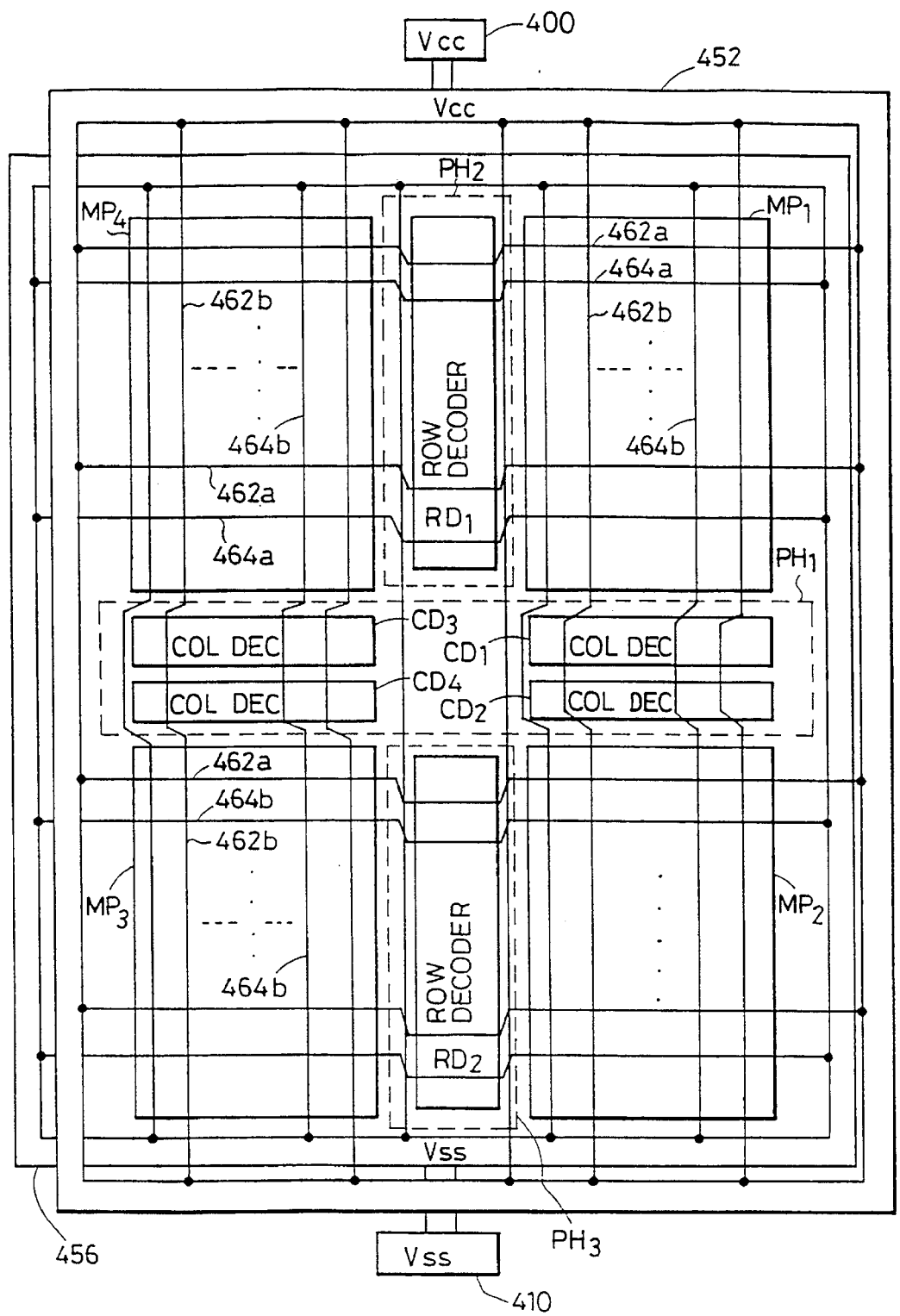
FIG. 16 is a diagram showing an entire arrangement of the semiconductor memory device according to a still further embodiment of the present invention.

FIG. 16 is a diagram schematically showing the entire structure of a semiconductor memory device according to a still further embodiment of the present invention. In FIG. 16, the semiconductor memory device includes four memory planes MP1, MP2, MP3 and MP4. The respective memory planes MP1–MP4 are individually driven. Each of the memory planes MP1–MP4 has a memory array arrangement as shown in FIG. 15 and is driven along a partial activation system. A peripheral circuit PH2 including a row decoder RD1 is provided between the memory plane and the memory plane MP4. A peripheral circuit PH3 including a row decoder RD2 is arranged between the memory plane MP2 and the memory plane MP3. A peripheral circuit MP1 PH1 including column decoders CD1–CD4 is arranged between the memory planes MP1 and MP4 and the memory planes MP2 and MP3. The peripheral circuit PH1 also includes an IO gate and an address buffer.

Even in a semiconductor memory device having such arrangement, power supply lines can be arranged in a meshed shape. A power supply potential Vcc applied to a pad 400 is transmitted by a main power supply line Vcc 452. The main power supply line 452 is disposed to surround the memory planes MP1–MP4. A ground potential Vss applied to the pad 410 is transmitted through a main ground line 456. The main ground line 456 is similarly arranged to surround the memory planes MP1–MP4. Sub power supply lines 462a, 462b, 464a and 464b are disposed in vertical and horizontal directions in the figure from the main power supply lines 452 and 456. The sub power supply lines 462a, 462b, 464a and 464b are disposed to respectively traverse a plurality of memory planes over the peripheral circuits PH1, PH2 and PH3.

In such an arrangement, by arranging, in the same manner as described previously, power supply lines with a large line width in a vertical direction in the figure in word line shunt regions or between column selection signal transmission lines and disposing the power supply lines 462a and 464a in a sense amp band region in a horizontal direction of the figure and contact is made at each crossing, the power supply potentials Vcc and Vss can be stably transmitted to each circuit portion.

As shown in FIG. 15, by disposing power supply lines in a meshed shape in a semiconductor memory device having a plurality of memory planes, a stable supply of a power supply potential is possible not only to a memory cell array portion but also to a peripheral circuit. In particular, it is possible to reliably prevent a fluctuation of a power supply potential due to charging/discharging of bit lines, etc., so that the semiconductor memory device can be reliably driven at a high speed during a memory operation.

In the arrangement shown in FIG. 16, the sub power supply lines 462a and 464a disposed in a horizontal direction may be used for any circuit operations as well as the sense amplifier driving.

A line width between the power supply lines 462b and 464b disposed in a vertical direction in FIG. 16 may be the same as that between the power supply lines 462a and 464a in a horizontal direction.

As is described above, a meshed shape arrangement of power supply lines achieves a sufficiently stable supply of power supply potentials Vcc and/or Vss and an enough line width between the power supply lines to prevent open-circuit of lines, resulting in stable and reliable supply of the power supply potentials through a low resistance even to power supply lines having a small line width.

Figure 17:
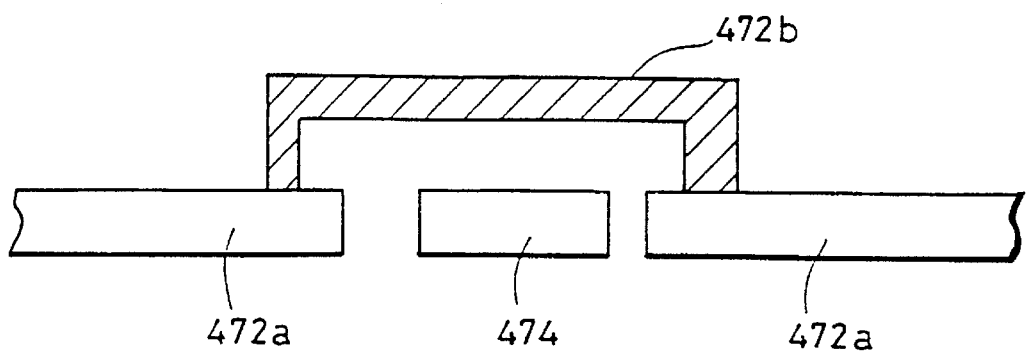
FIG. 17 is a diagram showing a connection form of a power supply line in a peripheral circuit portion shown in FIG.16.

FIG. 17 is a diagram showing a connection of power supply lines in a peripheral circuit portion. In FIG. 17, a power supply line 472 crosses with an interconnection layer 474 for use in a peripheral circuit. A power supply line 472a interconnects with an interconnection layer 472b at a crossing, thereby preventing the power supply line 472a from being in contact with the interconnection layer 474 of the peripheral circuit. At this time, the same interconnection material may be used for the power supply line 472a and the interconnection layer 472b for connection, or different interconnection materials may be used. A material of a power supply line on a memory plane can be different from that of a power supply line in a peripheral circuit portion. It is therefore possible to realize a meshed shape power supply arrangement achieving a stable supply of power supply potentials Vcc and Vss without adversely affecting interconnection of the peripheral circuit and without paying a chip area penalty.

Figure 18:
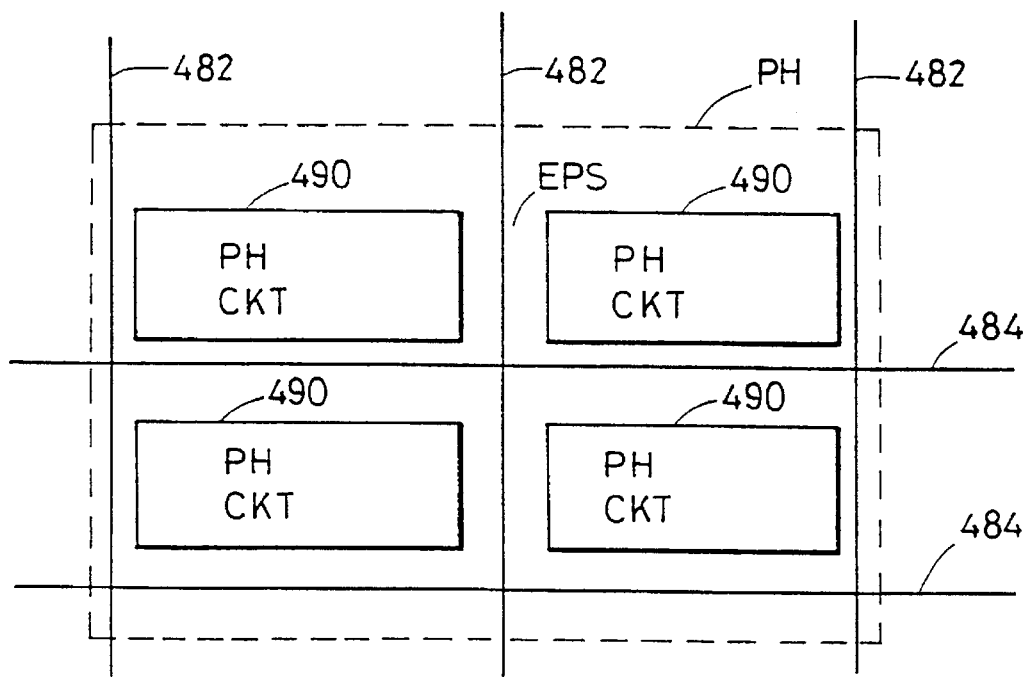
FIG. 18 is a diagram showing an example of an arrangement of a power supply line in the peripheral circuit portion shown in FIG. 16.

In FIG. 17, she power supply line is made in a multi-layer structure to be interconnected with each other on an interconnection layer of a peripheral circuit. Alternatively, the power supply lines may be arranged in an empty space EPS in the peripheral circuit PH as shown in FIG. 18. In this case, it is not necessary that power supply lines are arranged in a multi-layer structure at a crossing, and a meshed shape power supply line arrangement can be obtained with ease.

The peripheral circuit PH usually includes various circuit elements (decoder, etc.). However, empty space exists between different circuits because of circuit configuration. Use of such empty space EPS to dispose interconnection Layers enables power supply lines to be disposed in a meshed shape without increasing the number of interconnection layers and paying an area penalty. In FIG. 18, the peripheral circuit PH includes four peripheral circuit components 490, and power supply lines 482 and 484 are disposed in empty space EPS between adjacent peripheral circuit components.

[Epilogue]

As described in the foregoing, according to the present invention, power supply lines for supplying an operation power supply potential and a ground potential are arranged in a meshed shaped in the semiconductor memory device. Therefore, it is possible to stably supply a power supply potential to a desired circuit portion to achieve a semiconductor memory device which stably operates at a high speed.

Power supply lines disposed in parallel with a sense amp band and a power supply line with a large width disposed in a direction orthogonal to the sense amp band are connect with each other. Therefore, it is possible to reliably prevent a potential of a sense amp drive signal line from varying and obtain a dynamic-type semiconductor memory device capable of stable sensing operation at high speed.

Sense amp drive components provided for a predetermined number of sense amplifiers connect sense amp drive signal lines to the proximate power supply lines, so that stable and high-speed charging/discharging of the sense amp drive lines can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array including a plurality of memory cells arranged in rows and columns;

a plurality of word lines, each connecting one row of memory cells;

a plurality of pairs of bit lines, each pair connecting one column of memory cells;

a first power supply line arranged in parallel with said bit lines for transmitting a predetermined potential;

a sense amplifier band divided into a plurality of sense amplifier groups arranged in parallel with said word lines, each group including a plurality of sense amplifiers corresponding to a predetermined number of said bit line pairs for sensing and amplifying a potential of said corresponding bit line pairs;

a first and a second sense amp drive signal line for transmitting drive signals to said plurality of sense amplifiers, said first signal line being divided into multiple segments, each line segment being associated with at least one of said sense amplifier groups;

a second power supply line arranged in parallel with said sense amplifier groups and coupled to said first power supply line; and a plurality of sense amp drivers coupled between said second sense amp drive signal line and said second power supply line, for receiving a sense amp activation signal and connecting said second power supply line with said second sense amp drive signal line in response to said received sense amp activation signal, for generating a drive signal on said second sense amp drive signal line in response to said sense amp activation signal.

2. The semiconductor memory device of claim 1, further comprising:

a plurality of precharging circuits, each coupled between one of said segmented first sense amp drive signal lines and said second sense amp drive signal line, for maintaining each of said segmented first lines and said second line at a predetermined precharge potential.

3. The semiconductor memory device of claim 2, wherein said second sense amp drive signal line is a continuous line commonly connected to at least one adjacent sense amplifier group.

4. The semiconductor memory device of claim 2, wherein said second sense amp drive signal line is divided into multiple segments, each corresponding to and being coextensive with a segmented first sense amp drive signal line, and a precharging circuit is coupled between each of said first and second segmented sense amp drive signal lines.

5. A semiconductor memory device comprising:

a memory cell array including a plurality of memory cells arranged in rows and columns;

a plurality of word lines, each connecting one row of memory cells;

a plurality of pairs of bit lines, each pair connecting one column of memory cells;

a first power supply line arranged in parallel with said bit lines for transmitting a predetermined potential;

a sense amp band including a plurality of sense amplifiers corresponding to a predetermined number of said bit line pairs for sensing and amplifying a potential of said corresponding bit line pairs, said sense amp band being arranged in parallel with said word lines;

a first and a second sense amp drive signal line for transmitting drive signals to said plurality of sense amplifiers;

a plurality of precharging circuits coupled between said first and second sense amp drive signal lines, for maintaining each said first and second lines at a predetermined precharge potential;

a second power supply line arranged in parallel with said sense amp band and coupled to said first power supply line; and a plurality of sense amp drivers coupled between said second sense amp drive signal line and said second power supply line, for receiving a sense amp activation signal and connecting said second power supply line with said second sense amp drive signal line in response to said received sense amp activation signal, for generating a drive signal on said second sense amp drive signal line in response to said sense amp activation signal.

6. A semiconductor memory device comprising:

a memory cell array including a plurality of memory cells arranged in rows and columns;

a plurality of word lines, each connecting one row of memory cells;

a plurality of pairs of bit lines, each pair connecting one column of memory cells;

a sense amp band including a plurality of sense amplifiers, said sense amp band being arranged in parallel with said word lines, a first and a second sense amp drive signal line for transmitting drive signals to said plurality of sense amplifiers, said first line being divided into multiple segments, and a plurality of precharging circuits, each coupled between one of said segmented first sense amp drive signal lines and said second sense amp drive signal line, for maintaining each segmented first line and said second line at a predetermined precharge potential.

7. The semiconductor memory device of claim 6, wherein said second sense amp drive signal line is a continuous line commonly connected to said sense amplifiers of said sense amp band.

8. The semiconductor memory device of claim 7, wherein each of said sense amplifiers comprises an N channel sense amplifier region and a P channel sense amplifier region isolated from said N channel sense amplifier region, said regions sharing one bit line pair; and wherein said first and said second sense amp drive signal lines are arranged in parallel with said word lines, said first line crossing one of said N channel and P channel sense amplifier regions and said second line crossing the other one of said N channel and P channel sense amplifier regions.

9. The semiconductor memory device of claim 8, further comprising:

a logic circuit including, a column selecting means responsive to a column address for simultaneously selecting a plurality of bit line pairs, a plurality of pairs of I/O data transmission lines arranged in parallel with said word lines, and a plurality of column selection signal lines arranged in parallel with said bit line pairs for transmitting an output of said column selecting means to said plurality of I/O line pairs.

10. The semiconductor memory device of claim 5, wherein said second sense amp drive signal line is divided into multiple segments, each corresponding to and being coextensive with a segmented first sense amp drive signal line, and a precharging circuit is coupled between each of said first and second segmented sense amp drive signal lines.

11. The semiconductor memory device of claim 10, further comprising:

a logic circuit, said logic circuit including, a column selecting means responsive to a column address for simultaneously selecting a plurality of bit line pairs, a plurality of pairs of I/O data transmission lines arranged in parallel with said word lines, and a plurality of column selection signal lines arranged in parallel with said bit line pairs for transmitting an output of said column selecting means to said plurality of I/O line pairs.

12. The semiconductor memory device of claim 10, wherein each of said sense amplifiers comprises an N channel sense amplifier region and a P channel sense amplifier region isolated from said N channel sense amplifier region, said regions sharing one bit line pair; and wherein said first and said second sense amp drive signal lines are arranged in parallel with said word lines, said first line crossing one of said N channel and P channel sense amplifier regions and said second line crossing the other one of said N channel and P channel sense amplifier regions.

13. The semiconductor memory device of claim 12, further comprising:

a logic circuit including, a column selecting means responsive to a column address for simultaneously selecting a plurality of bit line pairs, a plurality of pairs of I/O data transmission lines arranged in parallel with said word lines, and a plurality of column selection signal lines arranged in parallel with said bit line pairs for transmitting an output of said column selecting means to said plurality of I/O line pairs.

14. A semiconductor memory device of claim 6, further comprising:

a logic circuit, said logic circuit including, a column selecting means responsive to a column address for simultaneously selecting a plurality of bit line pairs, a plurality of pairs of I/O data transmission lines arranged in parallel with said word lines, and a plurality of column selection signal lines arranged in parallel with said bit line pairs for transmitting an output of said column selecting means to said plurality of I/O line pairs.

15. A semiconductor memory device comprising:

a memory cell array including a plurality of memory cells arranged in rows and columns;

a plurality of word lines, each connecting one row of memory cells;

a plurality of pairs of bit lines, each pair connecting one column of memory cells;

a sense amp band including a plurality of sense amplifiers corresponding to a predetermined number of said bit line pairs for sensing and amplifying a potential of said corresponding bit line pairs, said sense amp band being arranged in parallel with said word lines;

a first and a second sense amp drive signal line for transmitting drive signals to said plurality of sense amplifiers; and a plurality of precharging circuits coupled between said first and second sense amp drive signal lines, for maintaining each said first and second lines at a predetermined precharge potential.

16. The semiconductor memory device of claim 15, further comprising:

a logic circuit, said logic circuit including, a column selecting means responsive to a column address for simultaneously selecting a plurality of bit line pairs, a plurality of pairs of I/O data transmission lines arranged in parallel with said word lines, and a plurality of column selection signal lines arranged in parallel with said bit line pairs for transmitting an output of said column selecting means to said plurality of I/O line pairs.

17. The semiconductor memory device of claim 15, wherein each said sense amplifier comprises an N channel sense amplifier region and a P channel sense amplifier region isolated from said N channel sense amplifier region, said regions sharing one bit line pair; and wherein said first and said second sense amp drive signal lines are arranged in parallel with said word lines, said first line crossing one of said N channel and P channel sense amplifier regions and said second line crossing the other one of said N channel and P channel sense amplifier regions.

18. The semiconductor memory device of claim 17, further comprising:

a logic circuit including, a column selecting means responsive to a column address for simultaneously selecting a plurality of bit line pairs, a plurality of pairs of I/O data transmission lines arranged in parallel with said word lines, and a plurality of column selection signal lines arranged in parallel with said bit line pairs for transmitting an output of said column selecting means to said plurality of I/O line pairs.

19. A semiconductor memory device comprising:

a memory cell array including a plurality of memory cells arranged in rows and columns;

a plurality of word lines, each connecting one row of memory cells;

a plurality of pairs of bit lines, each pair connecting one column of memory cells;

a first power supply line arranged in parallel with said bit line pairs for transmitting a predetermined potential;

a sense amplifier band arranged in parallel with said word lines, said band including a plurality of sense amplifiers, each for amplifying a potential of a corresponding bit line pair, each amplifier comprising, an N channel sense amplifier region and a P channel sense amplifier region isolated from said N channel sense amplifier region, said regions sharing one bit line pair; and a second power supply line arranged in a direction orthogonal to the bit line pairs and coupled to said first power supply line for coupling said predetermined potential to said sense amplifiers, said second line crossing a region including one of said N channel and P channel sense amplifier regions.

* * * * *